US012557637B2

(12) United States Patent
Xie et al.

(10) Patent No.: US 12,557,637 B2
(45) Date of Patent: Feb. 17, 2026

(54) STACKED TRANSISTORS WITH METAL VIAS

(71) Applicant: International Business Machines Corporation, Armonk, NY (US)

(72) Inventors: Ruilong Xie, Niskayuna, NY (US); Biswanath Senapati, Mechanicville, NY (US); Nicholas Anthony Lanzillo, Wynantskill, NY (US); Shahrukh Khan, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 434 days.

(21) Appl. No.: 18/332,947

(22) Filed: Jun. 12, 2023

(65) Prior Publication Data

US 2024/0413085 A1 Dec. 12, 2024

(51) Int. Cl.
*H01L 23/528* (2006.01)
*H01L 21/822* (2006.01)
(Continued)

(52) U.S. Cl.
CPC ....... *H01L 23/5286* (2013.01); *H10D 30/014* (2025.01); *H10D 30/43* (2025.01);
(Continued)

(58) Field of Classification Search
CPC ........... H01L 23/5286; H01L 21/76895; H01L 21/76897; H01L 21/76898; H01L 23/481;
(Continued)

(56) References Cited

U.S. PATENT DOCUMENTS 8,450,149 B2 5/2013 Bayan et al.
10,090,193 B1 * 10/2018 Chanemougame ... H01L 23/485
(Continued)

FOREIGN PATENT DOCUMENTS

CN 113424307 A 9/2021
DE 102020103710 A1 9/2020
EP 1804286 A1 7/2007

OTHER PUBLICATIONS

J. Ryckaert et al., "The Complementary FET (CFET) for CMOS scaling beyond N3," Symposium on VLSI Technology, 2018, pp. 141-142.
(Continued)

*Primary Examiner* — Tong-Ho Kim
(74) *Attorney, Agent, or Firm* — Kristofer Haggerty; Ryan, Mason & Lewis, LLP

(57) ABSTRACT

A semiconductor structure includes a stacked device structure having a first field-effect transistor having a first source/drain region, and a second field-effect transistor vertically stacked above the first field-effect transistor, the second field-effect transistor having a second source/drain region and a gate region having first sidewall spacers. The stacked device structure further includes a frontside source/drain contact disposed on a first portion of a sidewall and a top surface of the second source/drain region, a first metal via connected to the frontside source/drain contact and to a first backside power line, and second sidewall spacers disposed on a first portion of the first metal via. The first sidewall spacers comprise a first dielectric material and the second sidewall spacers comprise a second dielectric material different than the first dielectric material.

20 Claims, 34 Drawing Sheets

(51) Int. Cl.
  *H01L 21/8238* (2006.01)
  *H01L 27/092* (2006.01)
  *H01L 29/06* (2006.01)
  *H01L 29/417* (2006.01)
  *H01L 29/423* (2006.01)
  *H01L 29/66* (2006.01)
  *H01L 29/775* (2006.01)
  *H10D 30/01* (2025.01)
  *H10D 30/43* (2025.01)
  *H10D 30/67* (2025.01)
  *H10D 62/10* (2025.01)
  *H10D 64/01* (2025.01)
  *H10D 84/01* (2025.01)
  *H10D 84/03* (2025.01)
  *H10D 84/85* (2025.01)
  *H10D 88/00* (2025.01)

(52) U.S. Cl.
  CPC ..... *H10D 30/6729* (2025.01); *H10D 30/6735* (2025.01); *H10D 62/121* (2025.01); *H10D 64/017* (2025.01); *H10D 84/0167* (2025.01); *H10D 84/0186* (2025.01); *H10D 84/038* (2025.01); *H10D 84/856* (2025.01); *H10D 88/01* (2025.01)

(58) Field of Classification Search
  CPC .. H10D 30/014; H10D 30/43; H10D 30/6729; H10D 30/6735; H10D 62/121; H10D 64/017; H10D 84/0167; H10D 84/0186; H10D 84/038; H10D 84/856; H10D 88/01; H10D 30/0198; H10D 30/6757; H10D 30/797; H10D 62/822; H10D 62/116; H10D 84/0149; H10D 84/0151; H10D 84/83; H10D 88/00; B82Y 10/00
  USPC ........................................................ 257/351
  See application file for complete search history.

(56) References Cited

U.S. PATENT DOCUMENTS

| | | |
|---|---|---|
| 10,192,819 B1 | 1/2019 | Chanemougame et al. |
| 10,192,867 B1 | 1/2019 | Frougier et al. |
| 10,510,622 B1 | 12/2019 | Frougier et al. |
| 10,861,852 B2 | 12/2020 | Li et al. |
| 11,282,861 B2 | 3/2022 | Nelson et al. |
| 11,532,708 B2 | 12/2022 | Liebmann et al. |
| 2020/0098921 A1 | 3/2020 | Rachmady et al. |
| 2020/0135724 A1 | 4/2020 | Lin et al. |
| 2020/0266169 A1 | 8/2020 | Kang et al. |
| 2020/0294998 A1 | 9/2020 | Lilak et al. |
| 2021/0343715 A1 | 11/2021 | Wu et al. |
| 2021/0366907 A1* | 11/2021 | Liao ................. H10D 84/8311 |
| 2022/0045056 A1 | 2/2022 | Wang et al. |
| 2022/0102380 A1 | 3/2022 | Chanemougame et al. |
| 2022/0367461 A1 | 11/2022 | Chanemougame et al. |
| 2023/0139929 A1 | 5/2023 | Xie et al. |

OTHER PUBLICATIONS

International Search Report and Written Opinion of PCT/EP2024/063033, Sep. 3, 2024, 15 pages.

* cited by examiner

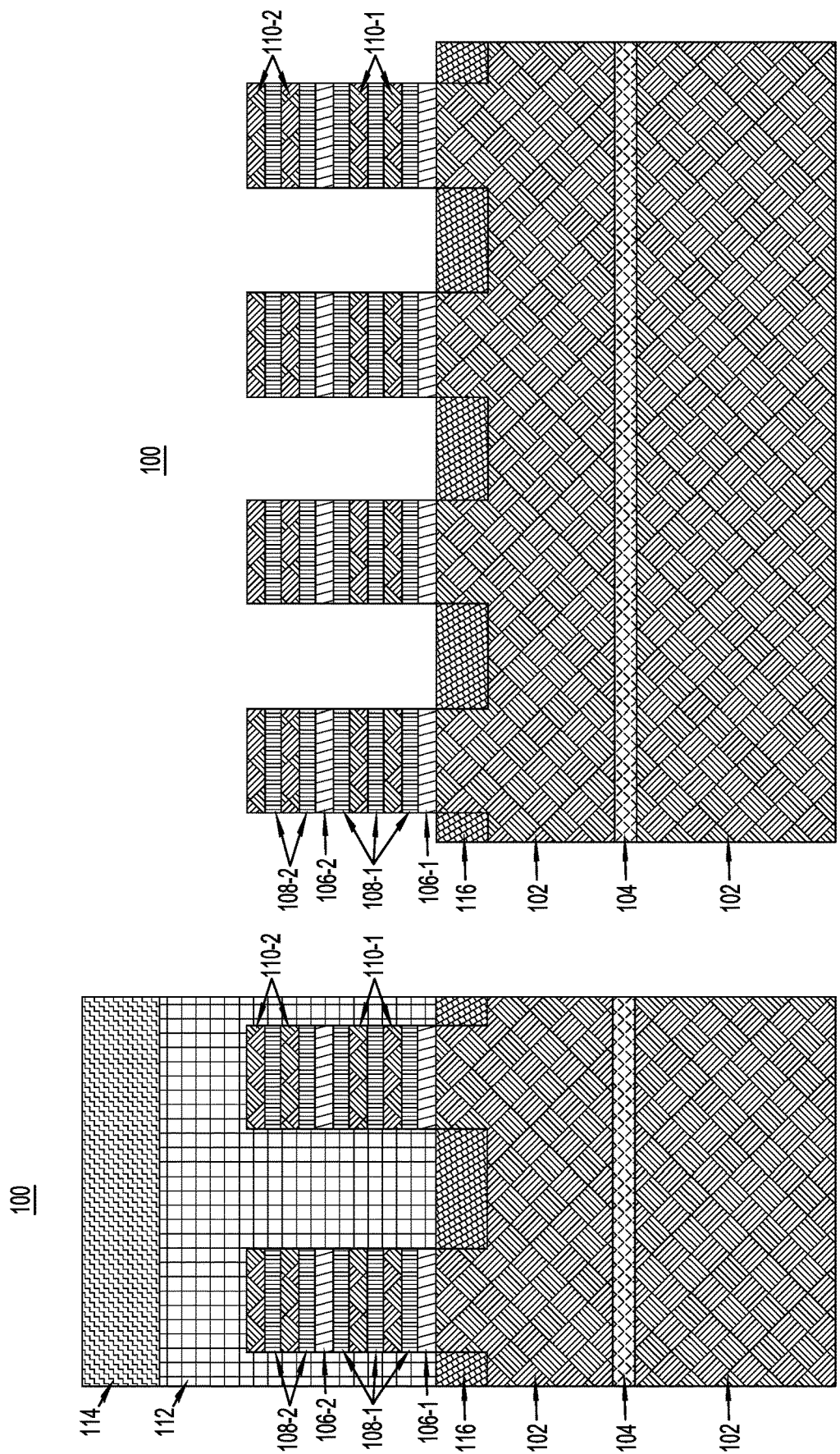

STACKED TRANSISTORS WITH METAL VIAS

BACKGROUND

A field-effect transistor (FET) is a transistor having a source, a gate, and a drain, the operation of which depends on the flow of carriers (electrons or holes) along a channel that runs between the source and drain. Current through the channel between the source and drain may be controlled by a transverse electric field under the gate. FETs are widely used for switching, amplification, filtering, and other tasks.

SUMMARY

Illustrative embodiments of the present application include techniques for use in semiconductor manufacture. In an illustrative embodiment, a semiconductor structure comprises a stacked device structure comprising a first field-effect transistor comprising a first source/drain region, and a second field-effect transistor vertically stacked above the first field-effect transistor, the second field-effect transistor comprising a second source/drain region and a gate region having first sidewall spacers. The semiconductor structure further comprises a frontside source/drain contact disposed on a first portion of a sidewall and a top surface of the second source/drain region. The semiconductor structure further comprises a first metal via connected to the frontside source/drain contact and to a first backside power line. The semiconductor structure further comprises second sidewall spacers disposed on a first portion of the first metal via. The first sidewall spacers comprise a first dielectric material and the second sidewall spacers comprise a second dielectric material different than the first dielectric material.

The semiconductor structure of the illustrative embodiment advantageously allows a stacked device structure to have a frontside source/drain contact on a portion of a sidewall and a top surface of a top source/drain region, and a metal via connected to the frontside source/drain contact and to a backside power line to allow for an improved connection between the metal via and the top source/drain region by utilizing different dielectric materials between the sidewall spacers of the gate region and the sidewall spacers of the metal via.

In one or more additional illustrative embodiments, as may be combined with the preceding paragraphs, the semiconductor structure further comprises a bottom dielectric insulator layer disposed on a first portion of a bottom surface of the first source/drain region.

In one or more additional illustrative embodiments, as may be combined with the preceding paragraphs, the bottom dielectric insulator layer comprises a third dielectric material different than the second dielectric material.

In one or more additional illustrative embodiments, as may be combined with the preceding paragraphs, a second portion of the first metal via is disposed in an interlevel dielectric layer.

In one or more additional illustrative embodiments, as may be combined with the preceding paragraphs, the semiconductor structure further comprises a backside metal contact disposed on a second portion of the bottom surface of the first source/drain region and connected to a second backside power line.

In one or more additional illustrative embodiments, as may be combined with the preceding paragraphs, the semiconductor structure further comprises another stacked device structure adjacent the stacked device structure comprising a third field-effect transistor comprising a third source/drain region, and a fourth field-effect transistor vertically stacked above the third field-effect transistor. The fourth field-effect transistor comprises a fourth source/drain region, a backside source/drain contact disposed on a second portion of a sidewall and a bottom surface of the third source/drain region, and a second metal via is connected to the backside source/drain contact and to a back-end-of-the-line layer.

In one or more additional illustrative embodiments, as may be combined with the preceding paragraphs, the semiconductor structure further comprises a backside metal contact disposed on a bottom surface of the first source/drain region and connected to a second backside power line.

In one or more additional illustrative embodiments, as may be combined with the preceding paragraphs, the frontside source/drain contact is further disposed on a back-end-of-the-line layer.

In another illustrative embodiment, a semiconductor structure comprises a first stacked device structure comprising a first field-effect transistor disposed comprising a first source/drain region, and a second field-effect transistor vertically stacked above the first field-effect transistor, the second field-effect transistor comprising a second source/drain region. The first stacked device further comprises a frontside source/drain contact disposed on a first portion of a sidewall and a top surface of the second source/drain region, and a first metal via connected to the frontside source/drain contact and to a first backside power line. The semiconductor structure further comprises a second stacked device structure adjacent the first stacked device structure. The second stacked device structure comprises a third field-effect transistor comprising a third source/drain region, and a fourth field-effect transistor vertically stacked above the third field-effect transistor, the fourth field-effect transistor comprising a fourth source/drain region. The second stacked device structure further comprises a first backside source/drain contact disposed on a second portion of a sidewall and a bottom surface of the third source/drain region, and a second metal is via connected on to the first backside source/drain contact and to a back-end-of-the-line layer.

The semiconductor structure of the illustrative embodiment advantageously allows a first stacked device structure to have a frontside source/drain contact on a portion of a sidewall and a top surface of a top source/drain region, and a metal via connected to the frontside source/drain contact and to a backside power line to allow for an improved connection between the metal via and the top source/drain region. The semiconductor structure of the illustrative embodiment further advantageously allows a second stacked device structure adjacent the first stacked device structure to have a backside source/drain contact on a portion of a sidewall and a bottom surface of a bottom source/drain region, and a metal via connected on to the backside source/drain contact and to a back-end-of-the-line layer to allow for an improved connection between the metal via and the bottom source/drain region.

In one or more additional illustrative embodiments, as may be combined with the preceding paragraphs, the backside source/drain contact is further disposed on an interlayer dielectric layer.

In one or more additional illustrative embodiments, as may be combined with the preceding paragraphs, a bottom dielectric insulator layer is disposed on a second portion of the bottom surface of the third source/drain region, a first sidewall spacer and a second sidewall spacer are disposed on opposing sidewalls of the first stacked device structure and the second stacked device structure, and a dielectric fill is disposed between the first sidewall spacer and the second sidewall spacer.

In one or more additional illustrative embodiments, as may be combined with the preceding paragraphs, the bottom dielectric insulator layer comprises a first dielectric material, and the first and second sidewall spacers comprise a second dielectric material different than the first dielectric material.

In one or more additional illustrative embodiments, as may be combined with the preceding paragraphs, the dielectric fill comprises a third dielectric material different than the first dielectric material and the second dielectric material.

In one or more additional illustrative embodiments, as may be combined with the preceding paragraphs, the semiconductor structure further comprises a second backside source/drain contact disposed on the first source/drain region and connected to a second backside power line.

In yet another illustrative embodiment, a semiconductor structure comprises a first stacked transistor comprising a first nanosheet field-effect transistor disposed on a first bottom dielectric insulator layer, the first nanosheet field-effect transistor comprising a first gate structure, a second nanosheet field-effect transistor device stacked above the first nanosheet field-effect transistor, the second nanosheet field-effect transistor comprising a second gate structure having first sidewall spacers. The semiconductor structure further comprises a second stacked transistor adjacent the first stacked transistor comprising a third nanosheet field-effect transistor disposed on a second bottom dielectric insulator layer, the third nanosheet field-effect transistor comprising a third gate structure, and a fourth nanosheet field-effect transistor device stacked above the third nanosheet field-effect transistor, the fourth nanosheet field-effect transistor comprising a fourth gate structure having second sidewall spacers. The semiconductor structure further comprises a third sidewall spacer and a fourth sidewall spacer disposed on opposing sidewalls of the first stacked transistor and the second stacked transistor, and a first metal via disposed between the third sidewall spacer and the fourth sidewall spacer.

The semiconductor structure of the illustrative embodiment advantageously allows a stacked device structure to have an improved connection between a metal via and a top source/drain region and a bottom source/drain region by utilizing different dielectric materials between the first bottom dielectric insulator layer, the second bottom dielectric insulator layer, the first sidewall spacers and the second sidewall spacers and the third sidewall spacer and the fourth sidewall spacer.

In one or more additional illustrative embodiments, as may be combined with the preceding paragraphs, the first bottom dielectric insulator layer, the second bottom dielectric insulator layer, the first sidewall spacers and the second sidewall spacers comprise a first dielectric material and the third sidewall spacer and the fourth sidewall spacer comprise a second dielectric material different than the first dielectric material.

In one or more additional illustrative embodiments, as may be combined with the preceding paragraphs, the metal via is connected to a back-end-of-the-line layer and to a backside power line.

In one or more additional illustrative embodiments, as may be combined with the preceding paragraphs, a frontside source/drain contact is disposed on a portion of a sidewall and a top surface of a source/drain region of the second nanosheet field-effect transistor; and a second metal via is connected to the frontside source/drain contact and to a first backside power line.

In one or more additional illustrative embodiments, as may be combined with the preceding paragraphs, a backside metal contact is disposed on a bottom surface of a source/drain region of the first nanosheet field-effect transistor and connected to a second backside power line.

In one or more additional illustrative embodiments, as may be combined with the preceding paragraphs, a backside source/drain contact is disposed on a portion of a sidewall and a bottom surface of a source/drain region of the third nanosheet field-effect transistor; and a second metal via is connected to the backside source/drain contact and to a back-end-of-the-line layer.

These and other exemplary embodiments will be described in or become apparent from the following detailed description of exemplary embodiments, which is to be read in connection with the accompanying drawings.

BRIEF DESCRIPTION OF THE DRAWINGS

Exemplary embodiments will be described below in more detail, with reference to the accompanying drawings, of which:

FIG. 1C is a cross-sectional view of the semiconductor structure taken along the Y1-Y1 axis of FIG. 1A at the first-intermediate fabrication stage, according to an illustrative embodiment.

FIG. 1D is a cross-sectional view of the semiconductor structure taken along the Y2-Y2 axis of FIG. 1A at the first-intermediate fabrication stage, according to an illustrative embodiment.

DETAILED DESCRIPTION

Figure 1B:
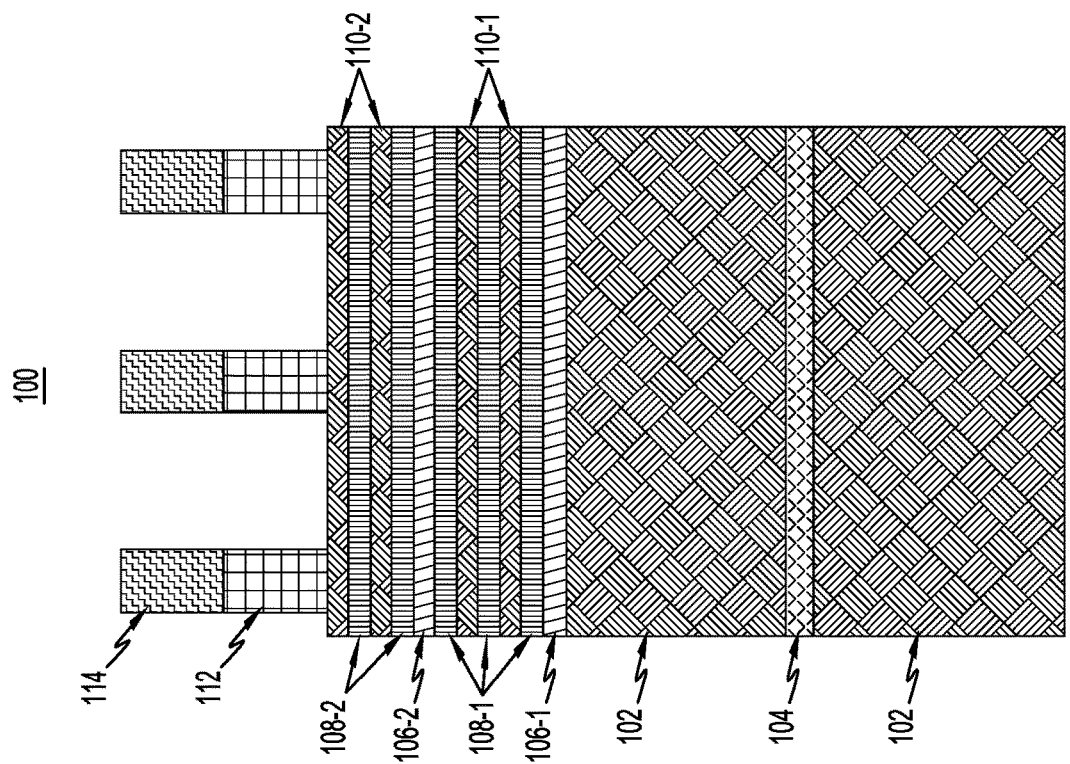
FIG. 1B is a cross-sectional view of the semiconductor structure taken along the X-X axis of FIG. 1A at the first-intermediate fabrication stage, according to an illustrative embodiment.

Illustrative embodiments of the invention may be described herein in the context of illustrative methods for forming a metal vias in stacked device structures to prevent routing congestion and reduce process complexity, along with illustrative apparatus, structures and devices formed using such methods. However, it is to be understood that embodiments of the invention are not limited to the illustrative methods, apparatus, structures and devices but instead are more broadly applicable to other suitable methods, apparatus, structures and devices.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

In the IC chip fabrication industry, there are three sections referred to in a typical IC chip build: front-end-of-line (FEOL), back-end-of-line (BEOL), and the section that connects those two together, the middle-of-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices. Accordingly, illustrative embodiments described herein may be directed to BEOL semiconductor processing and structures. BEOL is the second portion of IC fabrication where the individual devices (e.g., transistors, capacitors, resistors, etc.) become interconnected with wiring on the wafer, e.g., the metallization layer or layers. BEOL includes contacts, insulating layers (dielectrics), metal levels, and bonding sites for chip-to-package connections. In the BEOL, part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Present stacked FETs utilize a metal via to serve as an electrical path to connect both the top source/drain region to the backside interconnect of the wafer and the bottom source/drain region to the frontside BEOL interconnect. However, present metal vias have a poor connection to the top source/drain region and the bottom source/drain region resulting in routing congestion and high resistance. There is a need therefore to form stacked FETs without the above drawbacks. Accordingly, non-limiting illustrative embodiments described herein overcome the drawbacks discussed above by forming metal vias having a connection to both the top source/drain region and the bottom source/drain region of the stacked FET thereby improving routability and resistance.

Figure 1A:
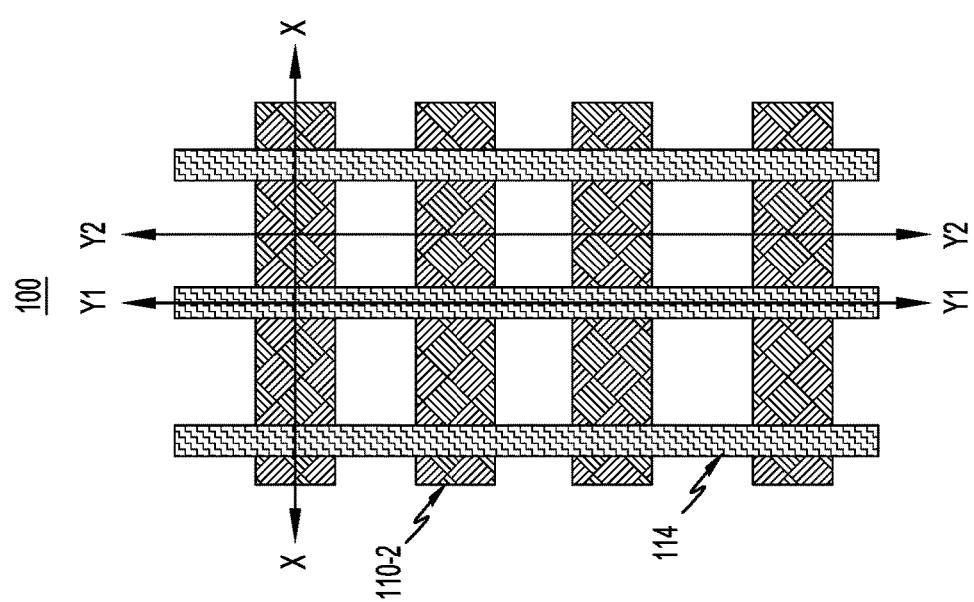
FIG. 1A is a top view illustrating a semiconductor structure for use at a first-intermediate fabrication stage, according to an illustrative embodiment.

Referring now to FIG. 1A-17C, FIG. 1A shows a top-down view of a semiconductor structure 100. A first side cross-sectional view of FIG. 1B is taken along the line X-X in the top-down view of FIG. 1A, a second side cross-sectional view of FIG. 1C is taken along the line Y1-Y1 in the top-down view of FIG. 1A and a third side cross-sectional view of FIG. 1D is taken along the line Y2-Y2 in the top-down view of FIG. 1A.

Semiconductor structure 100 shows substrate 102. Substrate 102 may be formed of any suitable semiconductor structure, including various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, substrate 102 is silicon.

An etch stop layer 104 is formed in the substrate 102. The etch stop layer 104 may comprise a buried oxide (BOX) layer or silicon germanium (SiGe), or another suitable material such as a III-V semiconductor epitaxial layer.

Nanosheet stacks are formed over the substrate 102, where the nanosheet stacks include sacrificial layers 106-1 and 106-2 (collectively, sacrificial layers 106), sacrificial layers 108-1 and 108-2 (collectively, sacrificial layers 108) and nanosheet channel layers 110-1 and 110-2 (collectively, nanosheet channel layers 110), and The sacrificial layers 106 and sacrificial layers 108 are illustratively formed of different sacrificial materials, such that they may be etched or otherwise removed selective to one another. In some embodiments, both the sacrificial layers 106 and sacrificial layers 108 are formed of SiGe, but with different percentages of Ge. For example, the sacrificial layers 106 may have a relatively higher percentage of Ge (e.g., 55% Ge), and the sacrificial layers 108 may have a relatively lower percentage of Ge (e.g., 25% Ge). Other combinations of different sacrificial materials may be used in other embodiments.

The nanosheet channel layers 110 may be formed of Si or another suitable material (e.g., a material similar to that used for the substrate 102). After nanosheet stack patterning, shallow trench isolation (STI) region 116 are formed. The STI region 116 may be formed of a dielectric material such as silicon dioxide ($SiO_2$), silicon oxycarbide (SiOC), silicon oxynitride (SiON), etc.

Semiconductor structure 100 further shows dummy gate 112 over the structure, with gate hard mask (HM) layer 114. The dummy gate 112 may be formed by blanket deposition of a dummy gate material (e.g., amorphous silicon (a-Si) or amorphous silicon germanium (a-SiGe) over a thin $SiO_2$ or titanium nitride (TiN) layer, or another suitable material) and material of the gate HM layer 114 (e.g., silicon nitride (SiN), a multi-layer of SiN and $SiO_2$, or another suitable material), followed by lithographic processing to result in the patterned gate HM layer 114 and underlying dummy gate 112.

Figure 2A:
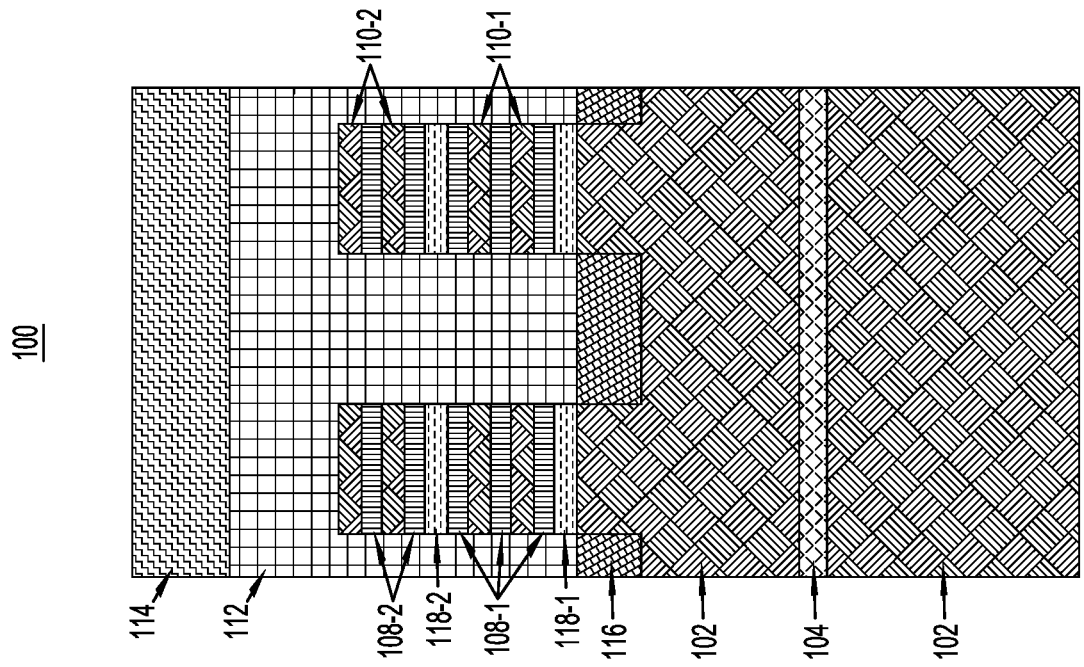
FIG. 2A is a cross-sectional view of the semiconductor structure taken along the X-X axis of FIG. 1A at a second-intermediate fabrication stage, according to an illustrative embodiment.
Figure 2B:
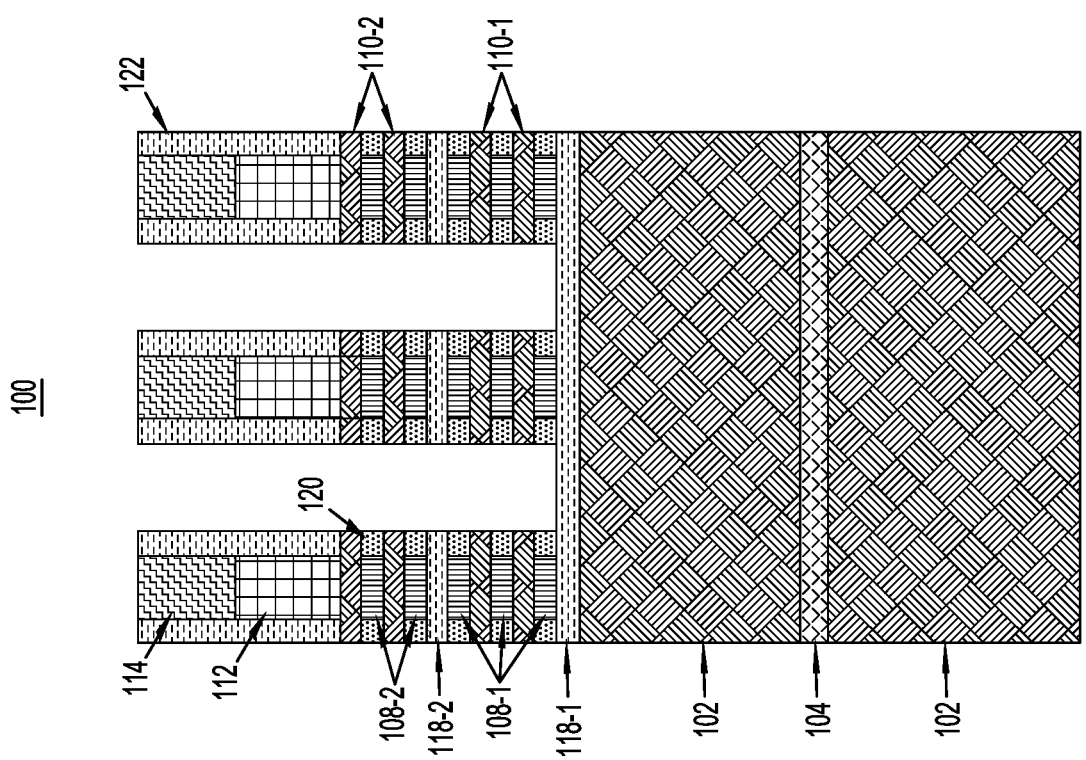
FIG. 2B is a cross-sectional view of the semiconductor structure taken along the Y1-Y1 axis of FIG. 1A at the second-intermediate fabrication stage, according to an illustrative embodiment.
Figure 2C:
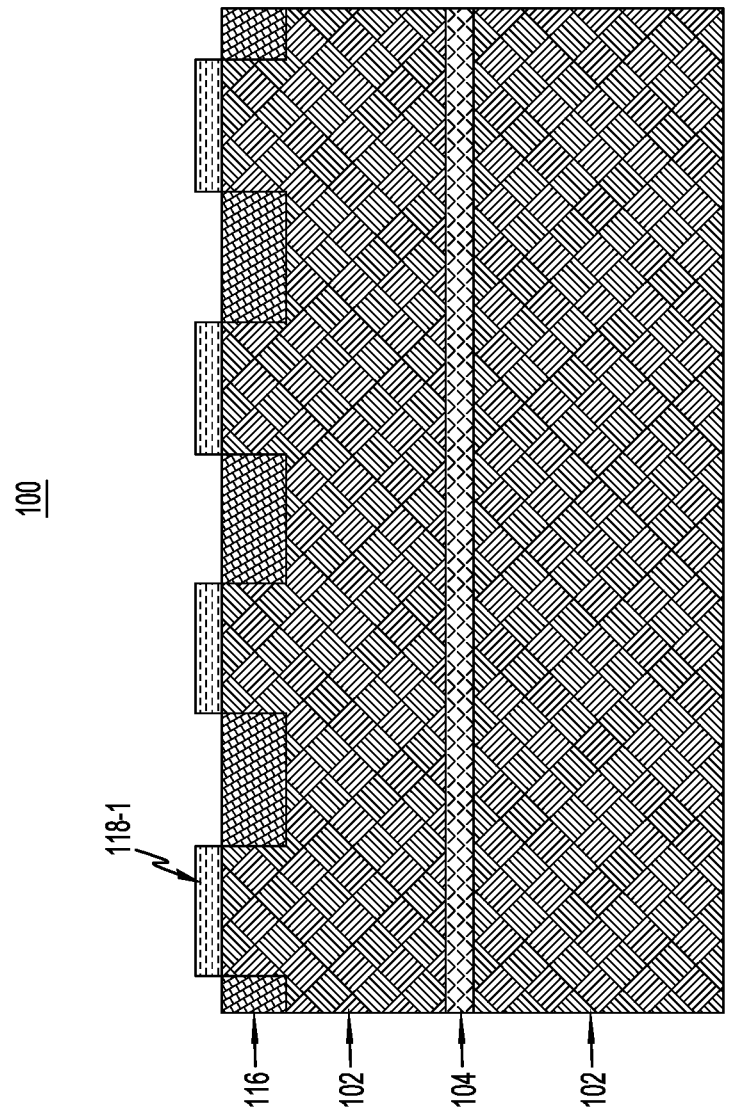
FIG. 2C is a cross-sectional view of the semiconductor structure taken along the Y2-Y2 axis of FIG. 1A at the second-intermediate fabrication stage, according to an illustrative embodiment.

FIGS. 2A-2C illustrate semiconductor structure 100 at a second-intermediate fabrication stage. During this stage, a bottom dielectric insulator (BDI) layer 118-1, middle dielectric insulator (MDI) layer 118-2, inner spacers 120 and sidewall spacers 122 are formed.

The BDI layer 118-1 and MDI layer 118-2 (collectively, dielectric insulator layers 118) may be formed of any suitable insulator or dielectric material, such as SiN, silicon boron carbide nitride (SiBCN), silicon oxycarbonitride (SiOCN), etc. The BDI layer 118-1 is formed in the region previously occupied by sacrificial layer 106-1, and the MDI layer 118-2 is formed in the region previously occupied by sacrificial layer 106-2, and may have similar sizing as the sacrificial layers.

The inner spacers 120 may be formed to fill indent spaces (e.g., resulting from indent etches of the sacrificial layers 108 prior to their removal). The inner spacers 120 may be formed of silicon nitride (SiN) or another suitable material such as SiBCN, silicon carbide oxide (SiCO), SiOCN, etc.

The sidewall spacers 122 may be formed of materials similar to that of the BDI layer 118-1. In one embodiment, sidewall spacers 122 are formed of the same insulator or dielectric material as BDI layer 118-1 such as SiN or SiBCN.

Figure 3B:
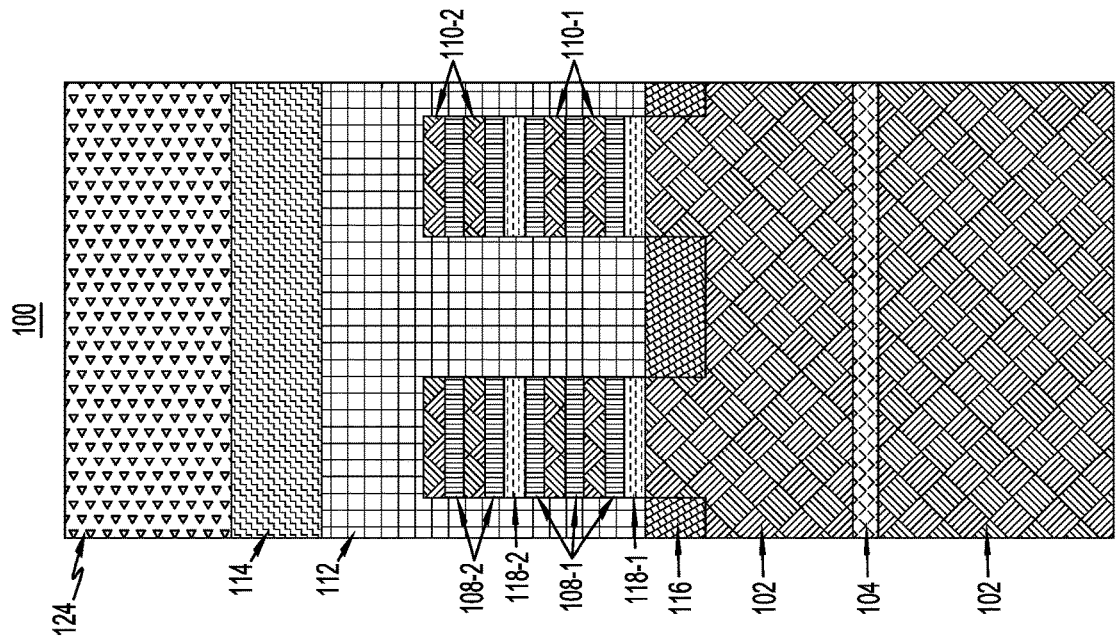
FIG. 3B is a cross-sectional view illustrating the semiconductor structure taken along the Y1-Y1 axis of FIG. 1A at the third-intermediate fabrication stage, according to an illustrative embodiment.
Figure 3A:
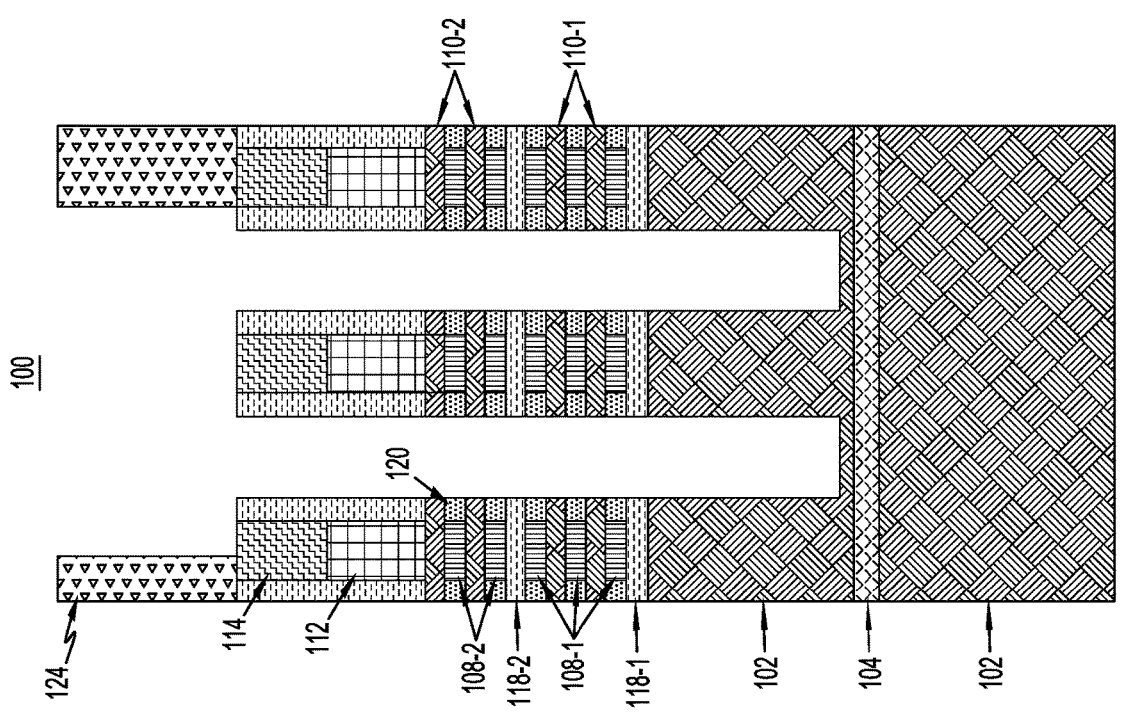
FIG. 3A is a cross-sectional view illustrating the semiconductor structure taken along the X-X axis of FIG. 1A at a third-intermediate fabrication stage, according to an illustrative embodiment.
Figure 3C:
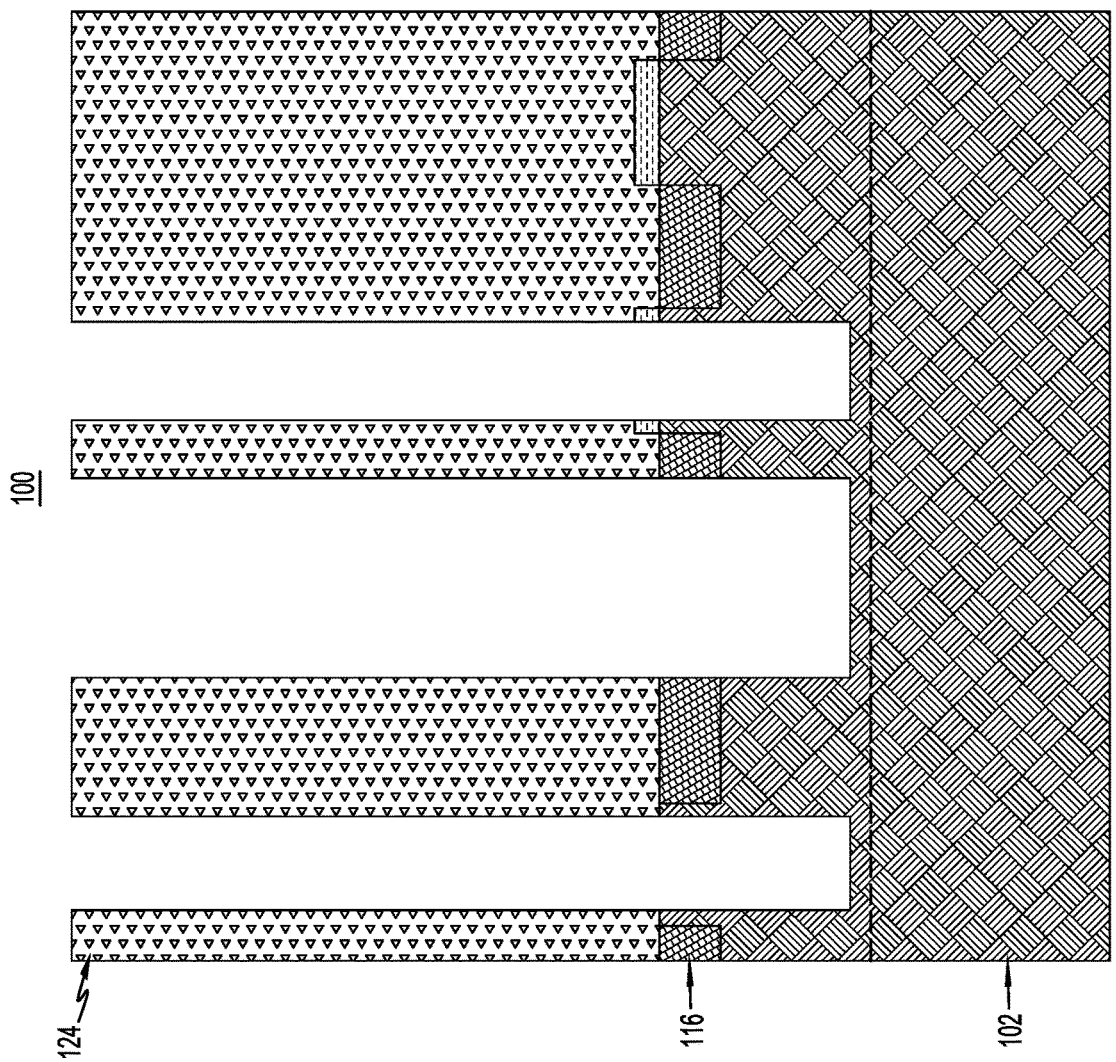
FIG. 3C is a cross-sectional view illustrating the semiconductor structure taken along the Y2-Y2 axis of FIG. 1A at the third-intermediate fabrication stage, according to an illustrative embodiment.

FIGS. 3A-3C show semiconductor structure 100 at a third-intermediate fabrication stage. During this stage, openings are extended through substrate 102 and STI region 116 for forming sacrificial placeholders as discussed below. The openings are formed by first depositing a mask layer 124 (such as an organic planarization layer (OPL) or a spin-on-carbon (SOC)) on semiconductor structure 100 using any conventional deposition process such spin-on coating or any other suitable deposition process. Next, the mask layer 124 is patterned and then selectively etched using, for example, reactive ion etching (RIE), to form the openings.

Figure 4B:
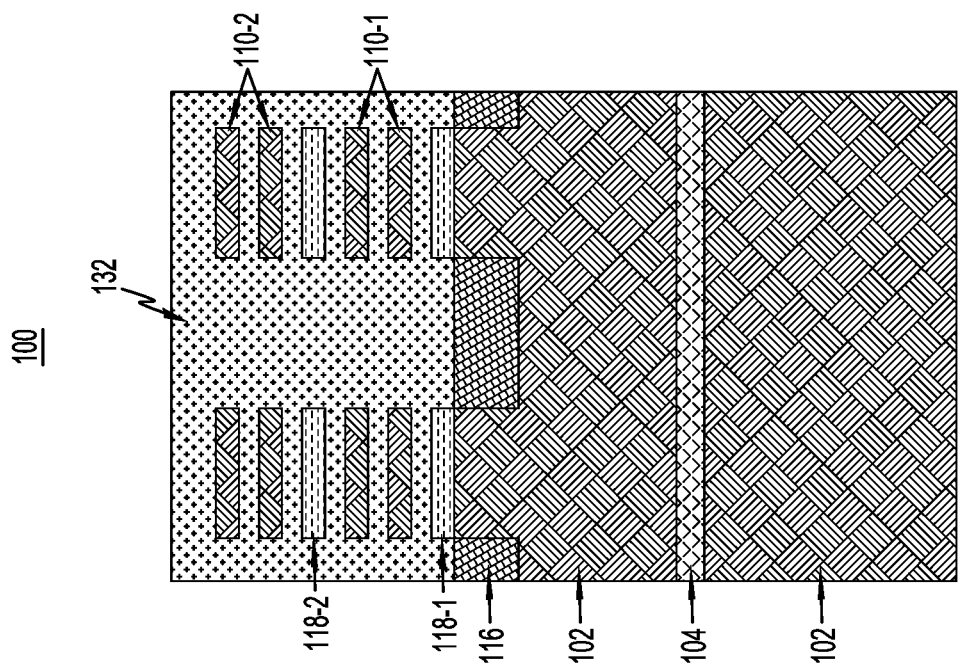
FIG. 4B is a cross-sectional view illustrating the semiconductor structure taken along the Y1-Y1 axis of FIG. 1A at the fourth-intermediate fabrication stage, according to an illustrative embodiment.
Figure 4A:
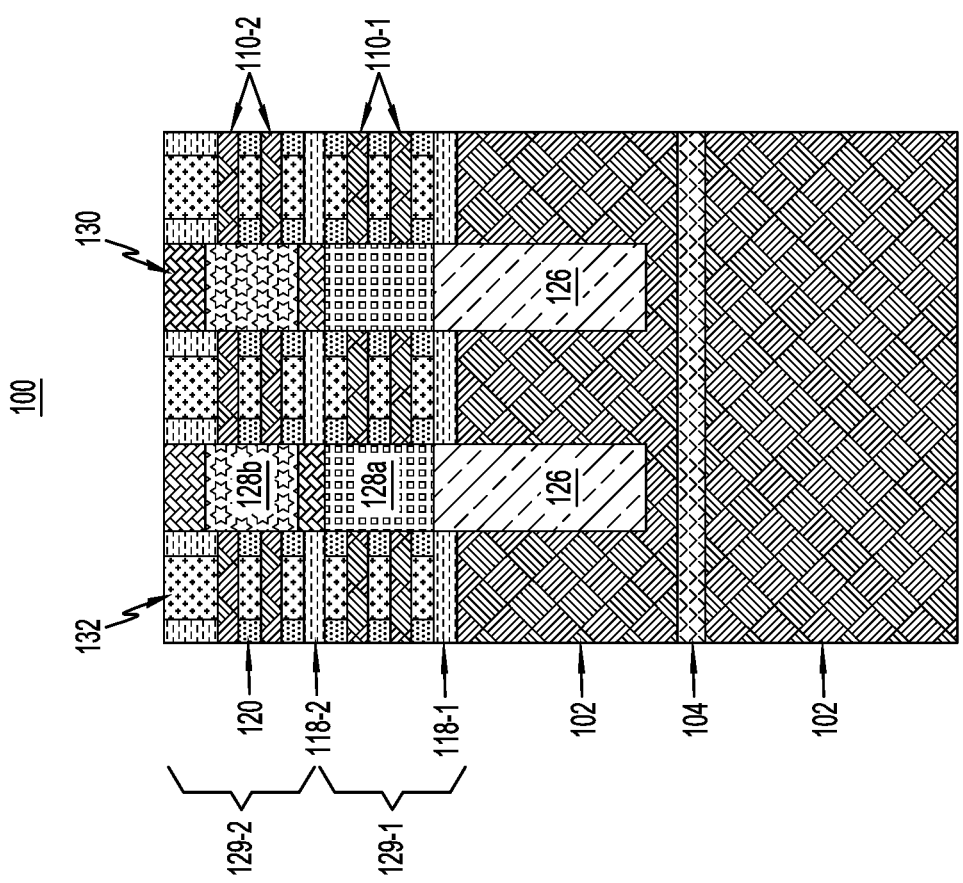
FIG. 4A is a cross-sectional view illustrating the semiconductor structure taken along the X-X axis of FIG. 1A at a fourth-intermediate fabrication stage, according to an illustrative embodiment.
Figure 4C:
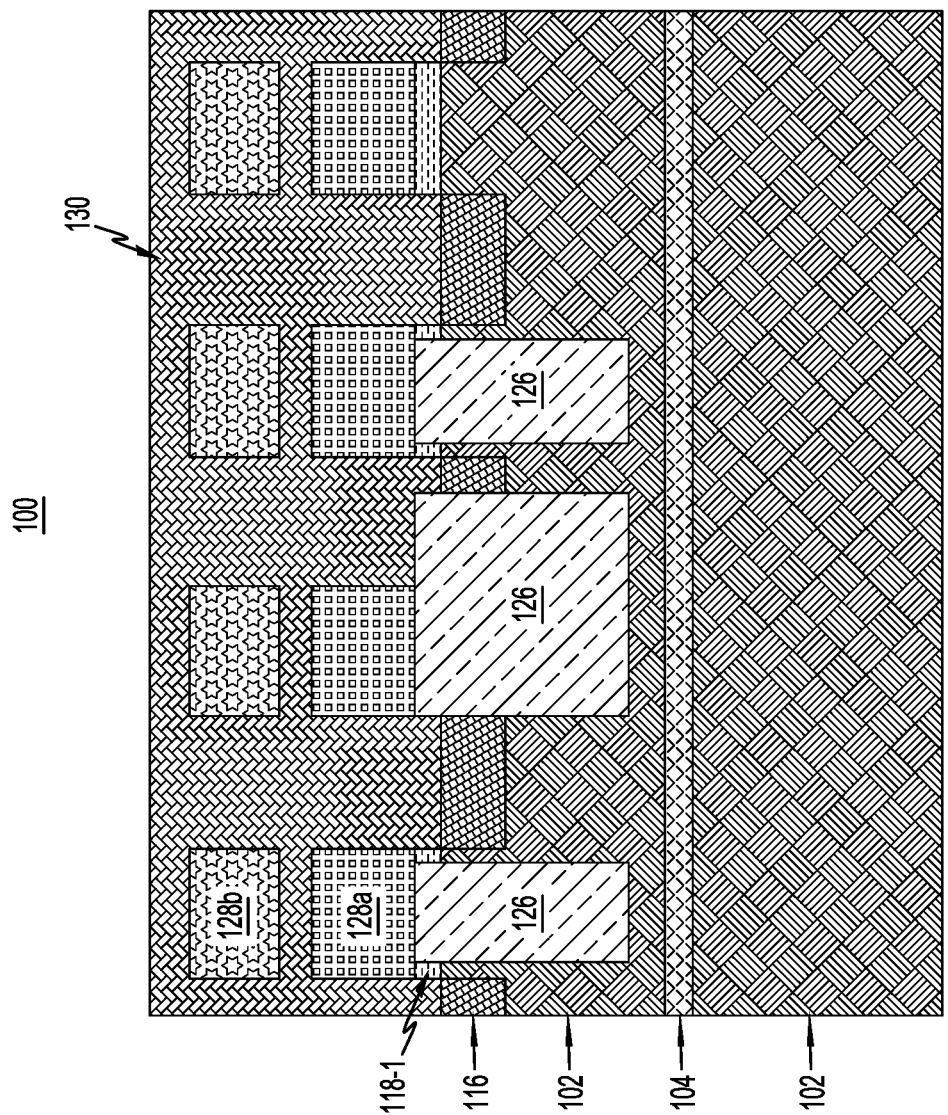
FIG. 4C is a cross-sectional view illustrating the semiconductor structure taken along the Y2-Y2 axis of FIG. 1A at the fourth-intermediate fabrication stage, according to an illustrative embodiment.

FIGS. 4A-4C show semiconductor structure 100 at a fourth-intermediate fabrication stage. During this stage, sacrificial placeholders 126, bottom source/drain regions 128a, top source/drain regions 128b, interlevel dielectric (ILD) layer 130 and replacement gate 132 create first transistor 129-1 and second transistor 129-2 in a stacked configuration. The sacrificial placeholders 126 are formed below the bottom source/drain regions 128a, and may be formed of a sacrificial material or materials, such as SiGe, titanium oxide ($TiO_x$), aluminum oxide ($AlO_x$), silicon carbide (SiC), etc. A mask layer may be patterned over the structure, followed by etching through underlying layers into the substrate 102. The sacrificial placeholders 126 may then be deposited, followed by epitaxial growth of the bottom source/drain regions 128a, deposition and planarization of the portion of the ILD layer 130 that is between the bottom source/drain regions 128a and the top source/drain regions 128b, followed by epitaxial growth of the top source/drain regions 128b and deposition and planarization of the portion of the ILD layer 130 that is over the top source/drain regions 128b.

The bottom source/drain regions 128a and the top source/drain regions 128b may be formed using epitaxial growth processes. The bottom source/drain regions 128a and the top source/drain regions 128b may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). In some embodiments, the epitaxy process comprises in-situ doping (dopants are incorporated in epitaxy material during epitaxy).

Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si: C) can be doped during deposition (in-situ doped) by adding dopants, such as n-type dopants (e.g., phosphorus or arsenic) or p-type dopants (e.g., boron or gallium), depending on the type of transistor to be formed. The dopant concentration in the source/drain can range from $1\times10^{19}$ $cm^{-3}$ to $3\times10^{21}$ $cm^{-3}$, or preferably between $2\times10^{20}$ $cm^{-3}$ to $3\times10^{21}$ $cm^{-3}$.

After the bottom source/drain regions 128a, top source/drain regions 128b and ILD layer 130 are formed, and a poly open chemical mechanical planarization (CMP) is carried out to reveal the dummy gate 112. The ILD layer 130 may be formed of any suitable isolating material, such as $SiO_2$, SiOC, SiON, etc. The dummy gate 112 and sacrificial layers 108 are removed, followed by formation of the replacement gate 132 (e.g., using replacement HKMG processing).

The replacement gate 132 includes a gate stack layer which may comprise a gate dielectric layer and a gate conductor layer. The gate dielectric layer may be formed of a high-k dielectric material. Examples of high-k materials include but are not limited to metal oxides such as $HfO_2$, hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate dielectric layer may have a uniform thickness in the range of 1 nm to 3 nm.

The gate conductor layer may include a metal gate or work function metal (WFM). The WFM for the gate conductor layer may be titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. It should be appreciated that various other materials may be used for the gate conductor layer as desired.

Figures 5A, 5B:
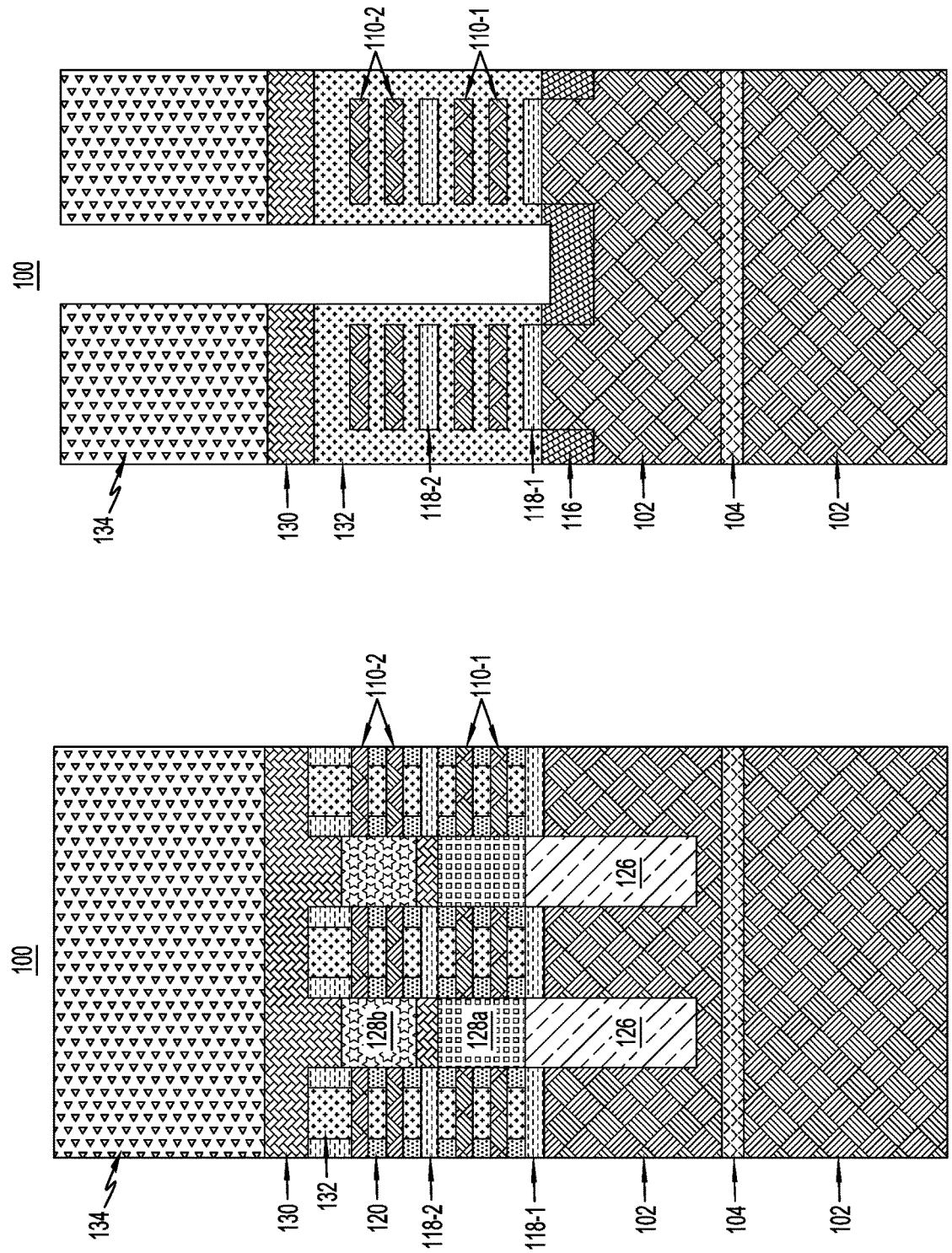
FIG. 5A is a cross-sectional view illustrating the semiconductor structure taken along the X-X axis of FIG. 1A at a fifth-intermediate fabrication stage, according to an illustrative embodiment.
FIG. 5B is a cross-sectional view illustrating the semiconductor structure taken along the Y1-Y1 axis of FIG. 1A at the fifth-intermediate fabrication stage, according to an illustrative embodiment.
Figure 5C:
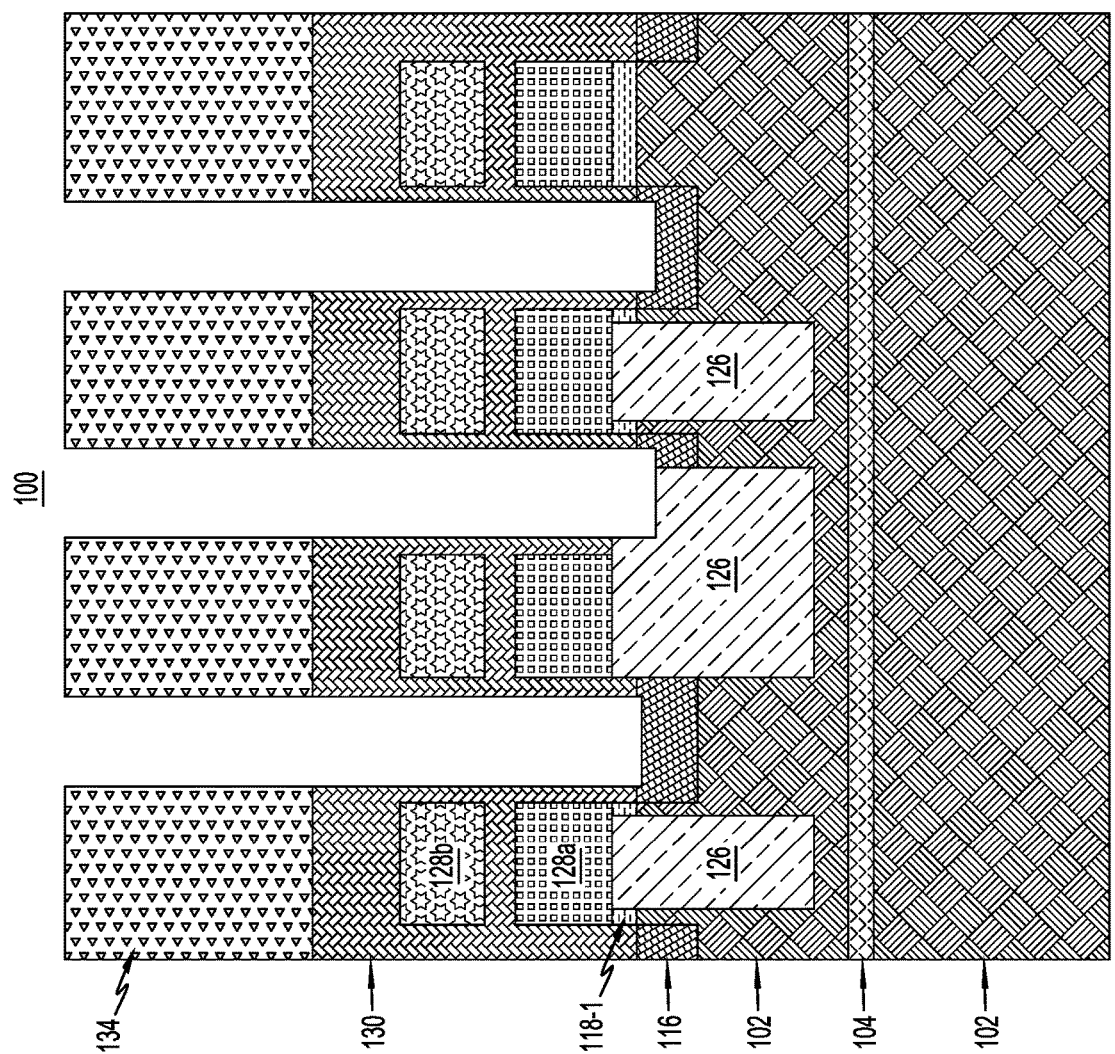
FIG. 5C is a cross-sectional view illustrating the semiconductor structure taken along the Y2-Y2 axis of FIG. 1A at the fifth-intermediate fabrication stage, according to an illustrative embodiment.

FIGS. 5A-5C illustrate semiconductor structure 100 at a fifth-intermediate fabrication stage. During this stage, a first opening is formed through replacement gate 132 to expose STI region 116 (see FIG. 5B) and a second and third opening are formed between adjacent ones of bottom source/drain regions 128a and top source/drain regions 128b to expose a portion of sacrificial placeholders 126 and STI region 116 for the second opening and STI region 116 for the third opening (see FIG. 5C). The openings are formed by first depositing a mask layer 134 (such as an OPL or a spin-on-carbon (SOC)) on semiconductor structure 100 using any conventional deposition process such spin-on coating or any other suitable deposition process. Next, the mask layer 134 is patterned and then selectively etched using, for example, RIE, to form the openings.

Figure 6A:
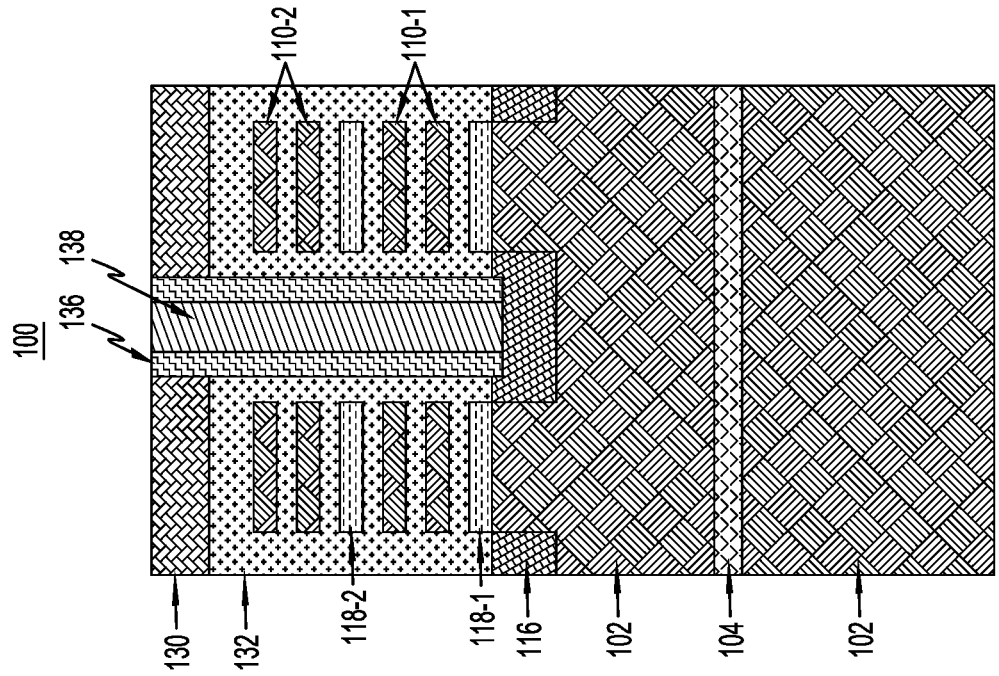
FIG. 6A is a cross-sectional view of the semiconductor structure taken along the X-X axis of FIG. 1A at a sixth-intermediate fabrication stage, according to an illustrative embodiment.
Figure 6B:
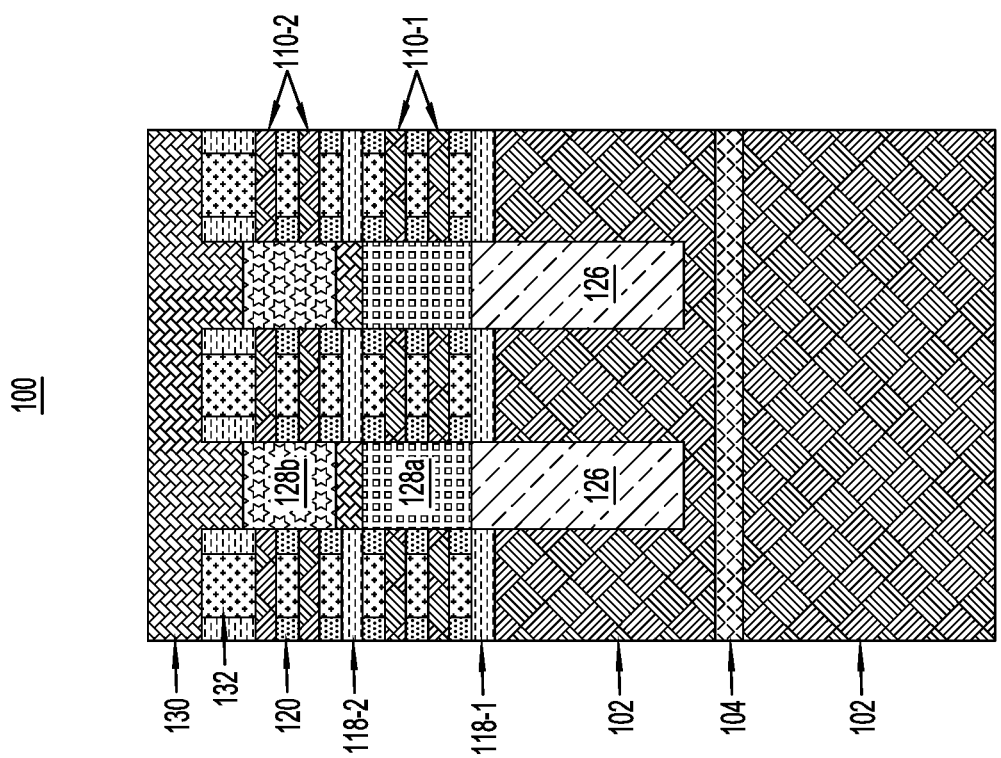
FIG. 6B is a cross-sectional view of the semiconductor structure taken along the Y1-Y1 axis of FIG. 1A at the sixth-intermediate fabrication stage, according to an illustrative embodiment.
Figure 6C:
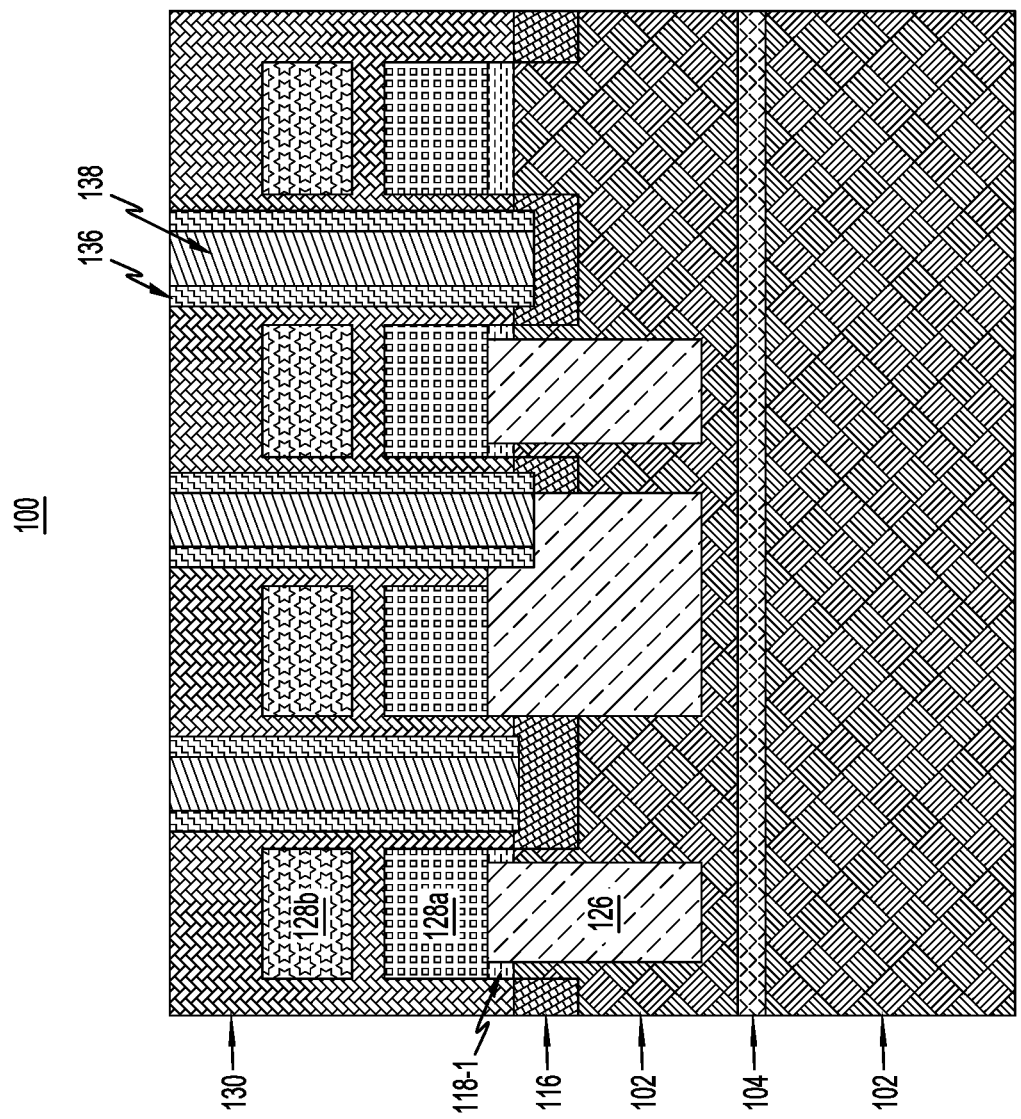
FIG. 6C is a cross-sectional view of the semiconductor structure taken along the Y2-Y2 axis of FIG. 1A at the sixth-intermediate fabrication stage, according to an illustrative embodiment.

FIGS. 6A-6C illustrate semiconductor structure 100 at a sixth-intermediate fabrication stage. During this stage, sidewall spacers 136 and a dielectric fill 138 are deposited in the openings, followed by a planarization process such as CMP. Sidewall spacers 136 and dielectric fill are deposited using any conventional deposition technique such as physical vapor deposition (PVD), atomic layer deposition (ALD), chemical vapor deposition (CVD), etc. In one embodiment, sidewall spacers 136 and a dielectric fill 138 are formed of a first dielectric material and a second dielectric material different then the first dielectric material. In one embodiment, sidewall spacers 136 and a dielectric fill 138 are formed of a first dielectric material and a second dielectric material different than the first dielectric material. In one embodiment, sidewall spacers 136 are formed of a dielectric material different than the dielectric material of BDI layer 118-1 and sidewall spacers 122. For example, sidewall spacers 136 are formed from a dielectric material such as SiN and BDI layer 118-1 and sidewall spacers 122 are formed from a dielectric material such as SiCO or SiOCN. Suitable dielectric material for dielectric fill 138 includes, for example, $SiO_2$.

Figure 7B:
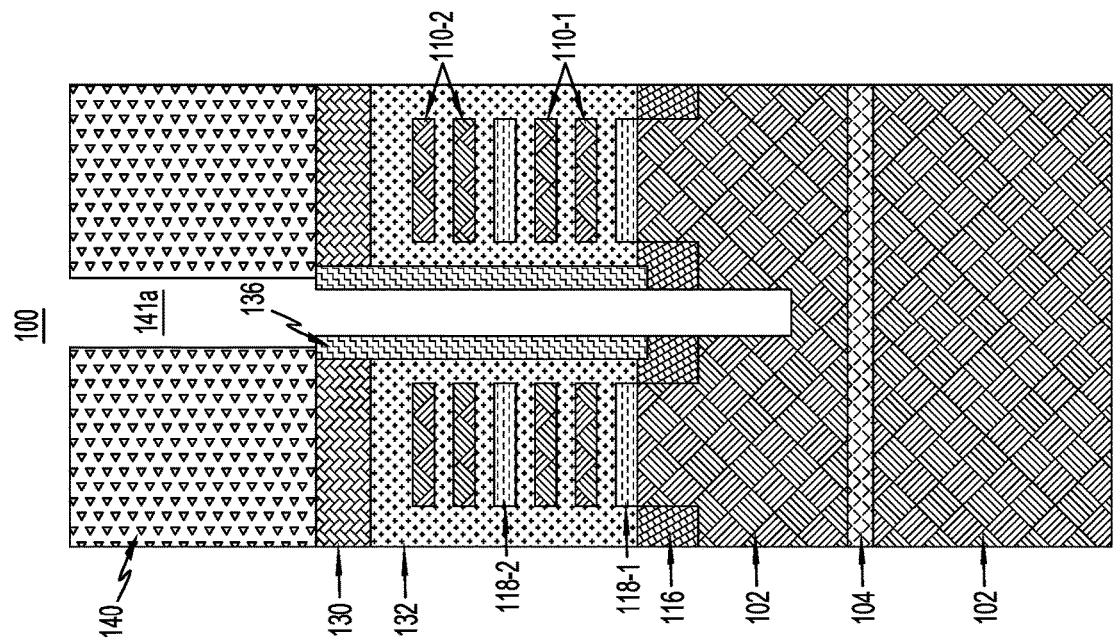
FIG. 7B is a cross-sectional view illustrating the semiconductor structure taken along the Y1-Y1 axis of FIG. 1A at the seventh-intermediate fabrication stage, according to an illustrative embodiment.
Figure 7A:
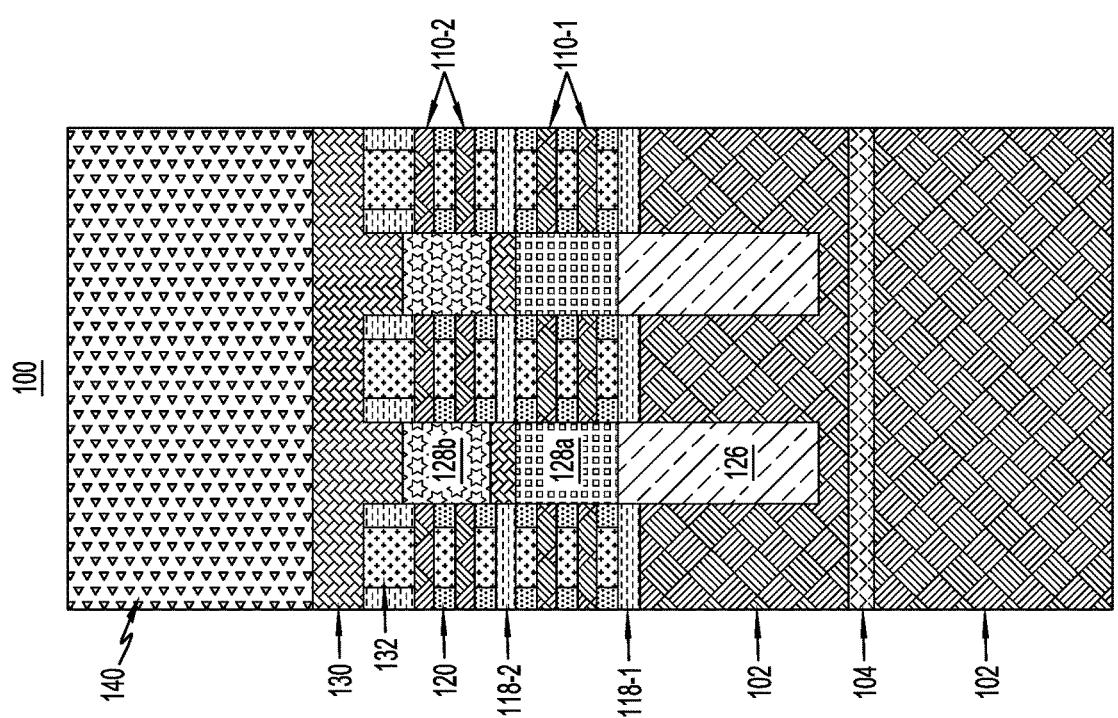
FIG. 7A is a cross-sectional view illustrating the semiconductor structure taken along the X-X axis of FIG. 1A at a seventh-intermediate fabrication stage, according to an illustrative embodiment.
Figure 7C:
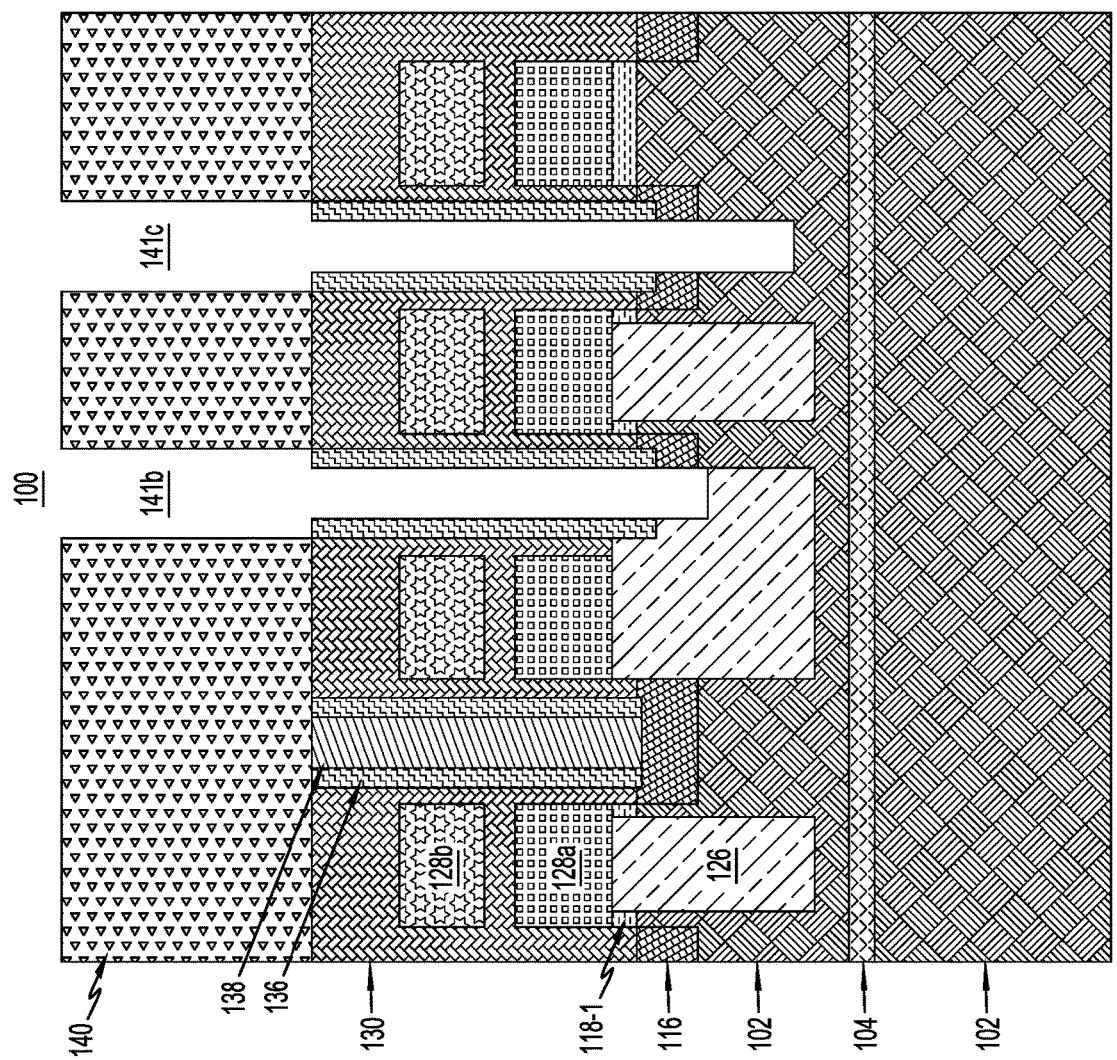
FIG. 7C is a cross-sectional view illustrating the semiconductor structure taken along the Y2-Y2 axis of FIG. 1A at the seventh-intermediate fabrication stage, according to an illustrative embodiment.

FIGS. 7A-7C illustrate semiconductor structure 100 at a seventh-intermediate fabrication stage. During this stage, a first opening 141a is formed through dielectric fill 138, STI region 116 and through a portion of substrate 102 between replacement gate 132 (see FIG. 7B) to expose sidewall spacers 136 and substrate 102 (see FIG. 7B) and a second and third openings 141b and 141c are formed through dielectric fill 138 between adjacent ones of bottom source/ drain regions 128a and top source/drain regions 128b to expose a portion of sacrificial placeholders 126 and STI region 116 for the second opening 141b and substrate 102 for the third opening 141c (see FIG. 7C). The openings are formed by first depositing a mask layer 140 (such as an OPL or a spin-on-carbon (SOC)) on semiconductor structure 100 using any conventional deposition process such spin-on coating or any other suitable deposition process. Next, the mask layer 140 is patterned and then selectively etched using, for example, RIE, to form the openings.

Figure 8A:
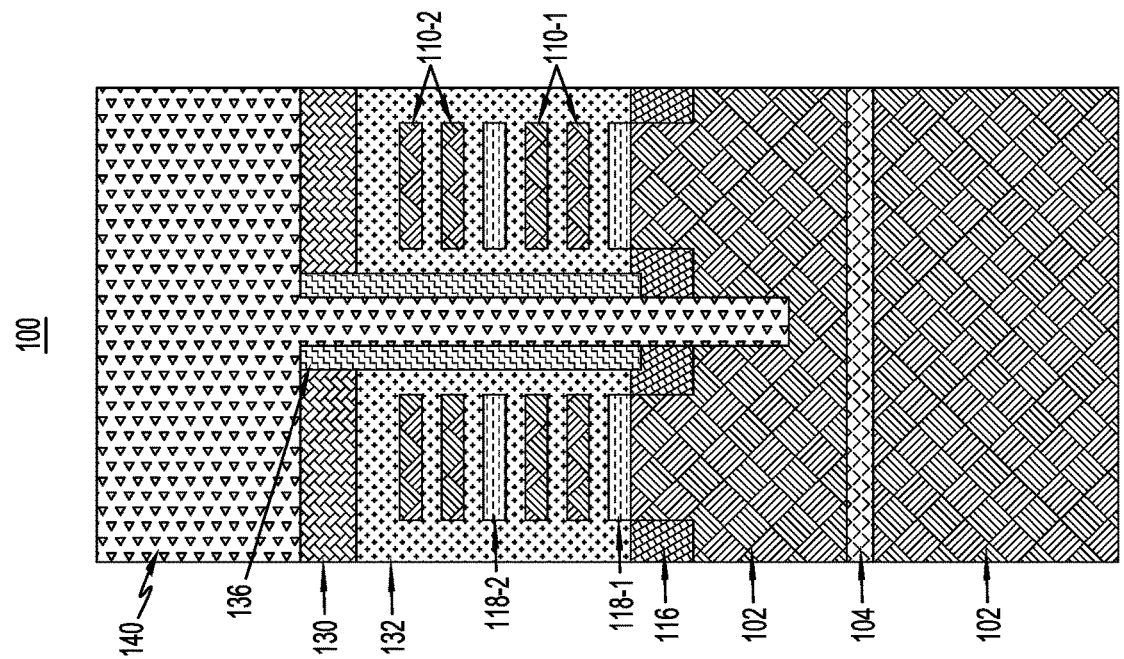
FIG. 8A is a cross-sectional view of the semiconductor structure taken along the X-X axis of FIG. 1A at an eighth-intermediate fabrication stage, according to an illustrative embodiment.
Figure 8B:
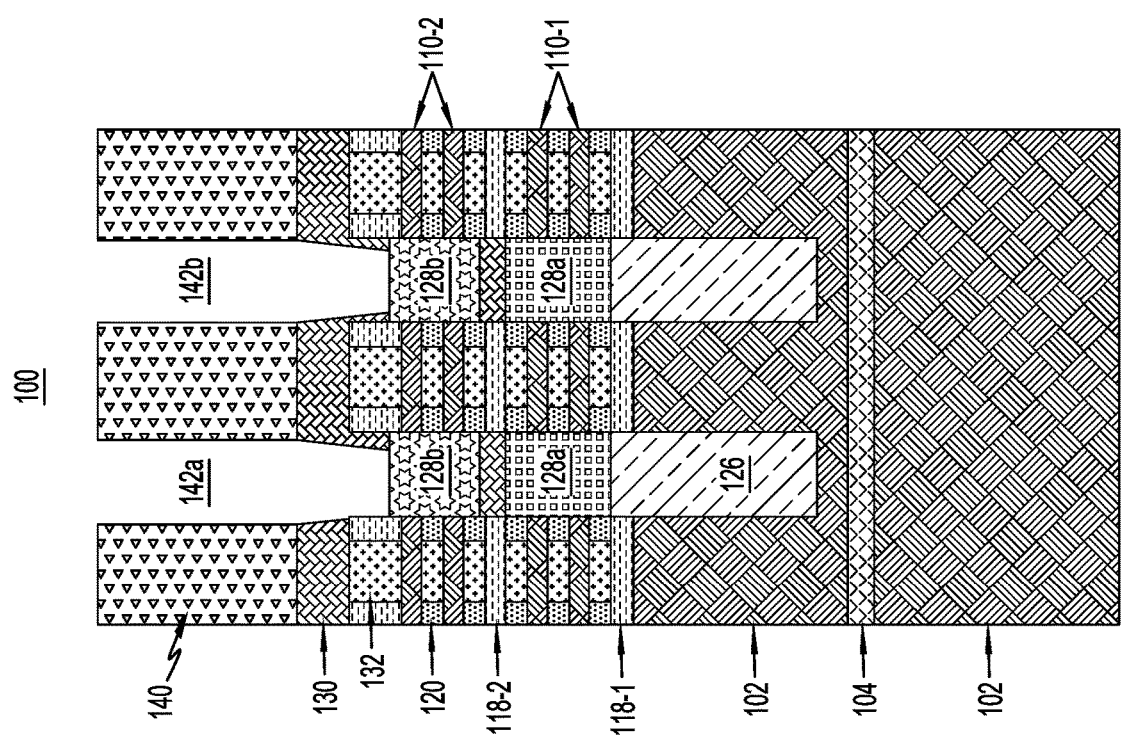
FIG. 8B is a cross-sectional view of the semiconductor structure taken along the Y1-Y1 axis of FIG. 1A at the eighth-intermediate fabrication stage, according to an illustrative embodiment.
Figure 8C:
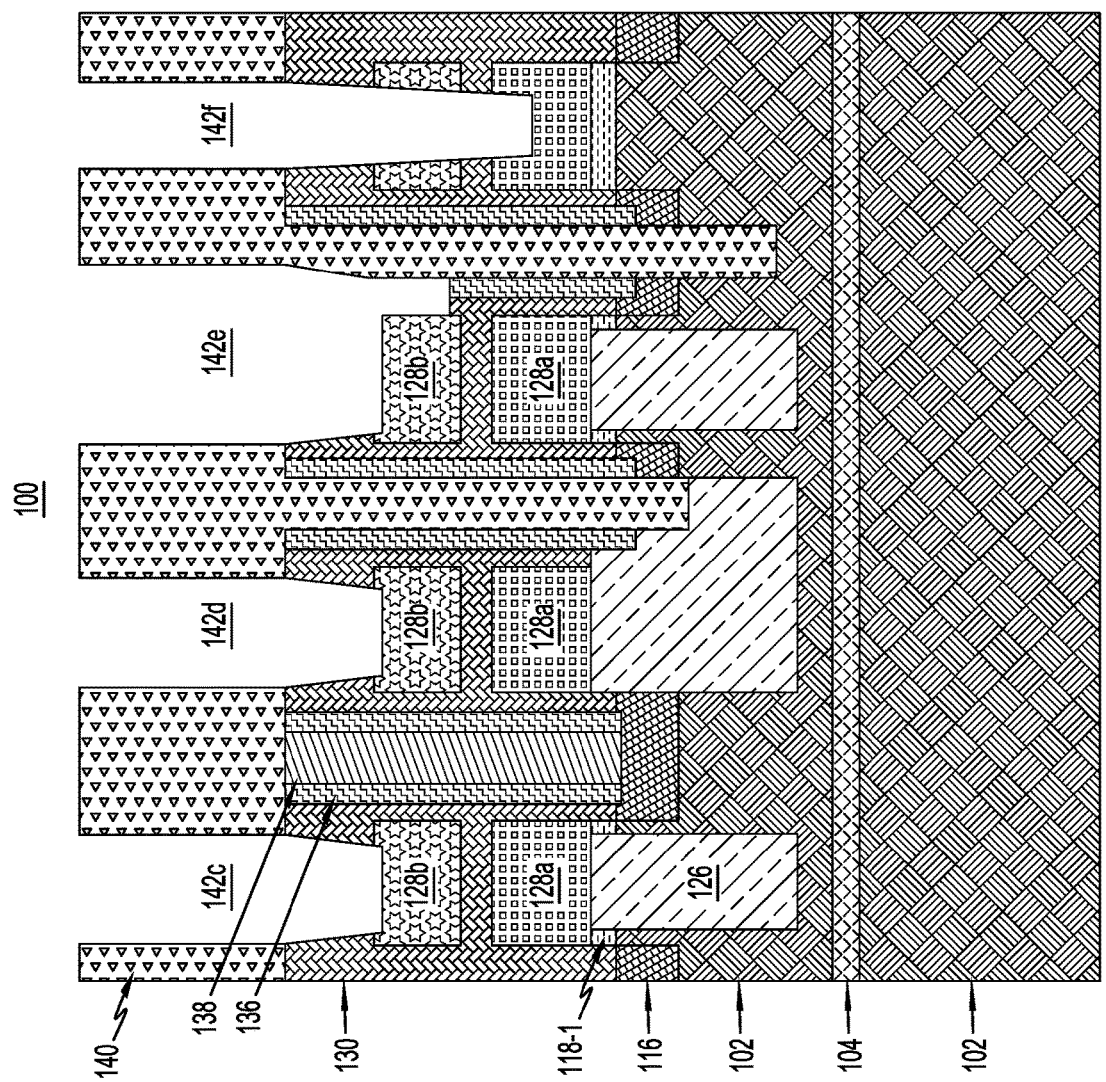
FIG. 8C is a cross-sectional view of the semiconductor structure taken along the Y2-Y2 axis of FIG. 1A at the eighth-intermediate fabrication stage, according to an illustrative embodiment.

FIGS. 8A-8C illustrate semiconductor structure 100 at an eighth-intermediate fabrication stage. During this stage, middle-of-the-line (MOL) contact openings are formed including formation of top source/drain contact openings 142a, 142b, 142c, 142d and 142e, and bottom source/drain contact opening 142f. For example, in an illustrative embodiment, top source/drain contact openings 142a, 142b, 142c, 142d and 142e, and bottom source/drain contact opening 142f can be formed by first depositing additional mask layer 140 in first, second and third openings 141a, 141b and 141c, and then utilizing conventional lithographic and etching processes such as RIE in at least mask layer 140 to form top source/drain contact openings 142a, 142b, 142c, 142d and 142e, and bottom source/drain contact opening 142f. As can be seen in FIG. 8C, by using different materials for sidewall spacers 122 and sidewall spacers 136, the etching process can selectively remove sidewall spacers 136 relative to sidewall spacers 122 to protect the replacement gate 132 in top source/drain contact opening 142a while exposing a top surface and sidewall of respective top source/ drain region 128b in top source/drain contact opening 142e.

Figure 9B:
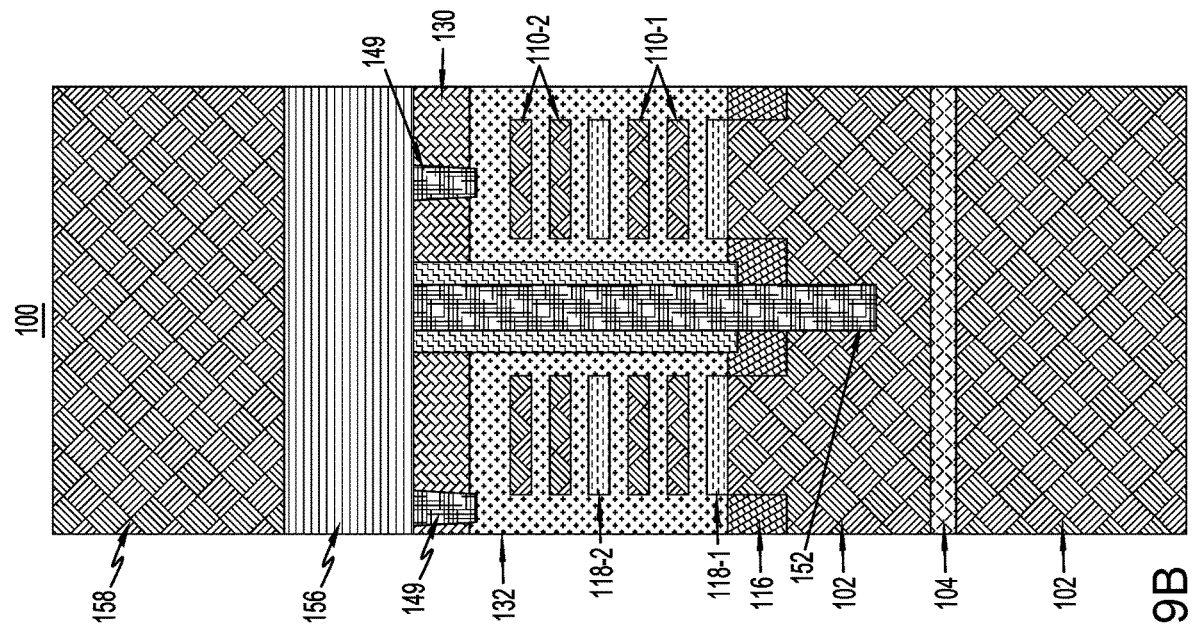
FIG. 9B is a cross-sectional view illustrating the semiconductor structure taken along the Y1-Y1 axis of FIG. 1A at the ninth-intermediate fabrication stage, according to an illustrative embodiment.
Figure 9A:
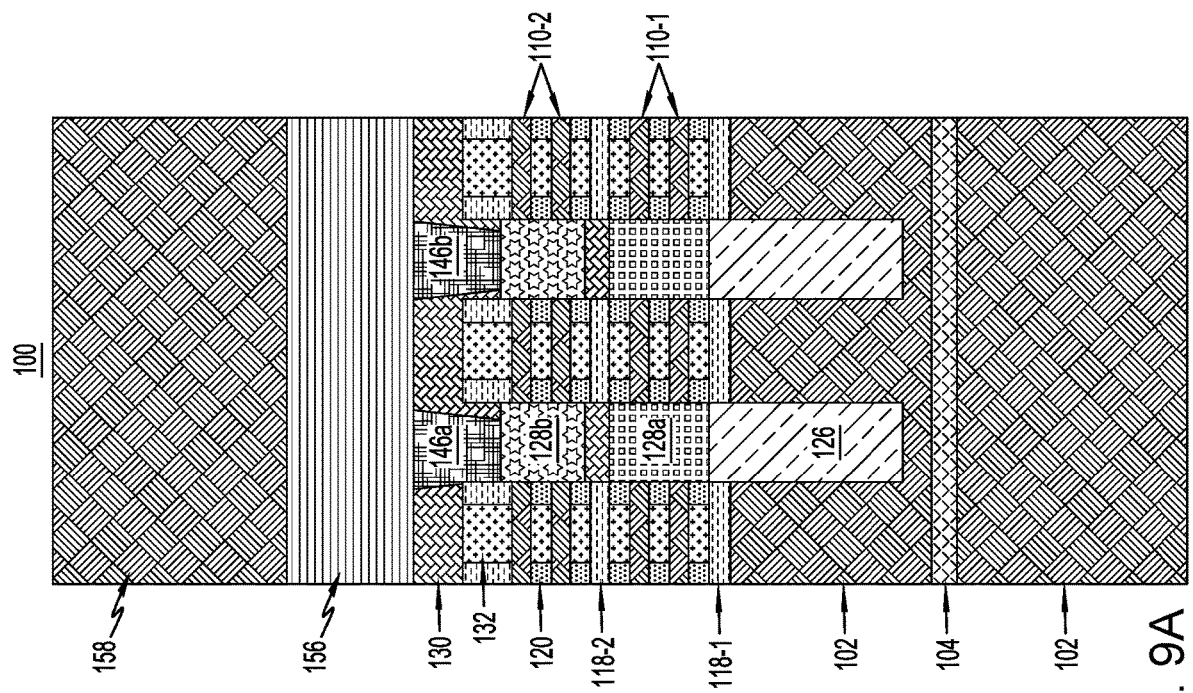
FIG. 9A is a cross-sectional view illustrating the semiconductor structure taken along the X-X axis of FIG. 1A at a ninth-intermediate fabrication stage, according to an illustrative embodiment.
Figure 9C:
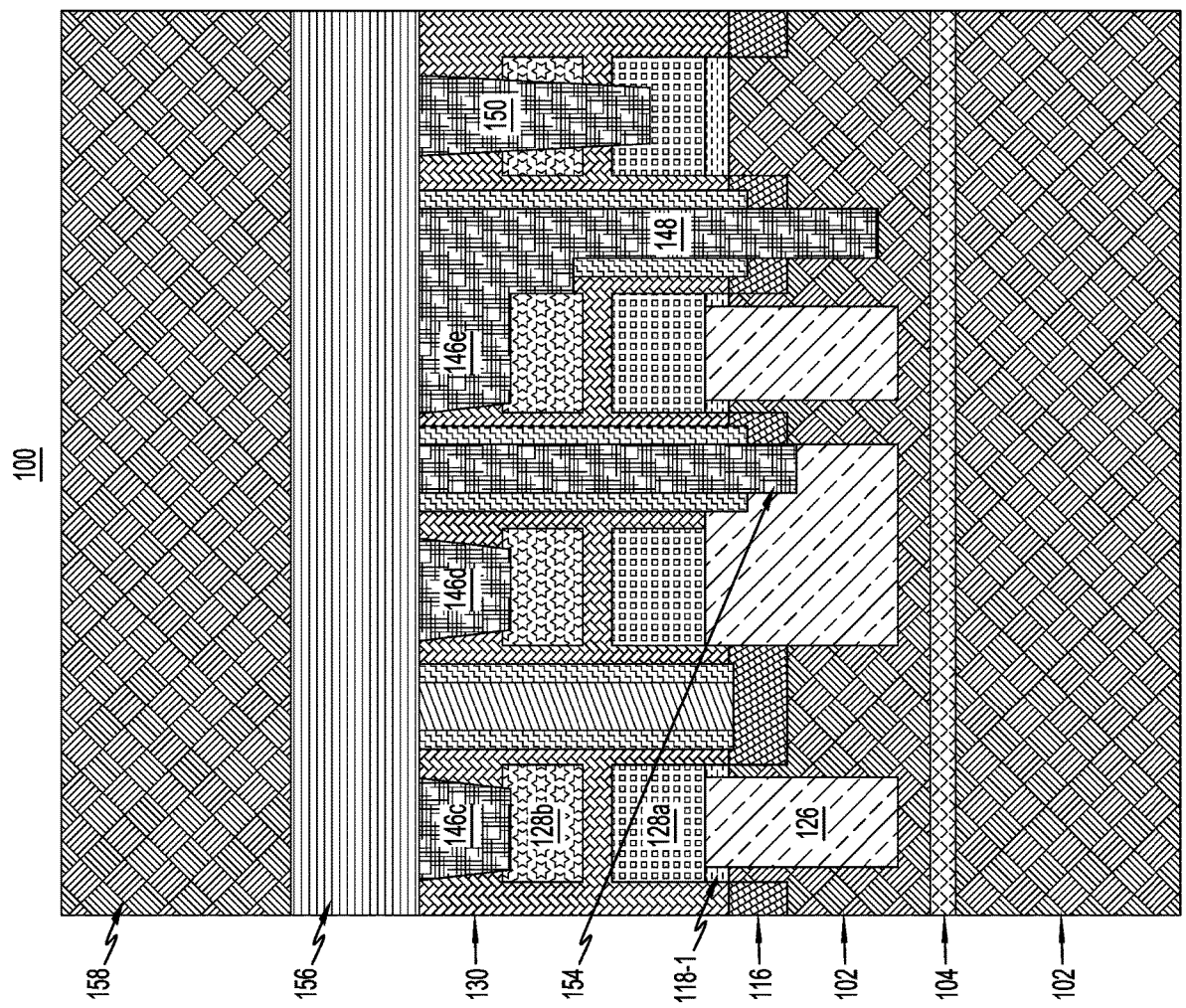
FIG. 9C is a cross-sectional view illustrating the semiconductor structure taken along the Y2-Y2 axis of FIG. 1A at the ninth-intermediate fabrication stage, according to an illustrative embodiment.

FIGS. 9A-9C illustrate semiconductor structure 100 at a ninth-intermediate fabrication stage. During this stage, frontside top source/drain contacts 146a, 146b, 146c and 146d, metal vias 148 and 154, gate contacts 149, bottom source/ drain contact 150 and MOL contact 152, are first formed. In an illustrative embodiment, a high conductance metal is deposited in the top source/drain contact openings 142a, 142b, 142c, 142d and 142e, and bottom source/drain contact opening 142f to form respective frontside top source/drain contacts 146a, 146b, 146c and 146d and bottom source/drain contact 150. Frontside top source/drain contact 146e is partially disposed on a sidewall and top surface of top source/drain regions 128b. Thus, frontside top source/drain contact 146e can also be referred to as partially wrapped-around frontside top source/drain contact 146e. In addition, metal via 148 can be formed by selectively removing mask layer 140 between adjacent bottom source/drain regions 128a and top source/drain regions 128b (see FIG. 9C) to form an extended via, followed by depositing at least a high conductance metal as discussed above.

For example, metal via 148 can include, for example, a silicide liner such as Ti, Ni, NiPt, followed by an adhesion metal liner such as TiN, and metal fill material such as tungsten (W), aluminum (Al), copper (Cu), cobalt (Co), ruthenium (Ru), molybdenum (Mo), or any other suitable conductive material. In various embodiments, the high conductance metal can be deposited by ALD, CVD, PVD, and/or plating. The high conductance metal can be planarized using, for example, a planarizing process such as CMP. Other planarization processes can include grinding and polishing.

Gate contacts 149 and MOL contact 152 and metal via 154 are formed utilizing conventional lithographic and etching processes. For example, gate contacts 149 can be formed utilizing conventional lithographic and etching processes in at least ILD layer 130, followed by depositing a high conductance metal as discussed above. MOL contact 152 can be formed utilizing conventional lithographic and etching processes by selectively removing dielectric fill 138 between replacement gate 132 (see FIG. 9B), followed by depositing a high conductance metal as discussed above. In addition, metal via 154 can be formed by selectively removing mask layer 140 between adjacent bottom source/drain regions 128a and top source/drain regions 128b (sec FIG. 9C) to form an extended via, followed by depositing a high conductance metal as discussed above. Metal via 154 will connect with bottom source/drain contact 164d, as discussed below in connection with FIG. 16C. The high conductance metal can be planarized using, for example, a planarizing process such as CMP. Other planarization processes can include grinding and polishing.

Next, a frontside back-end-of-line (BEOL) structure 156 is formed on semiconductor structure 100 followed by bonding of the structure (e.g., the frontside BEOL structure 156) to a carrier wafer 158. The frontside BEOL structure 156 includes various BEOL interconnect structures. The carrier wafer 158 may be formed of materials similar to that of the substrate 102, and may be formed over the frontside BEOL structure 156 using a wafer bonding process, such as dielectric-to-dielectric bonding.

Figure 10A:
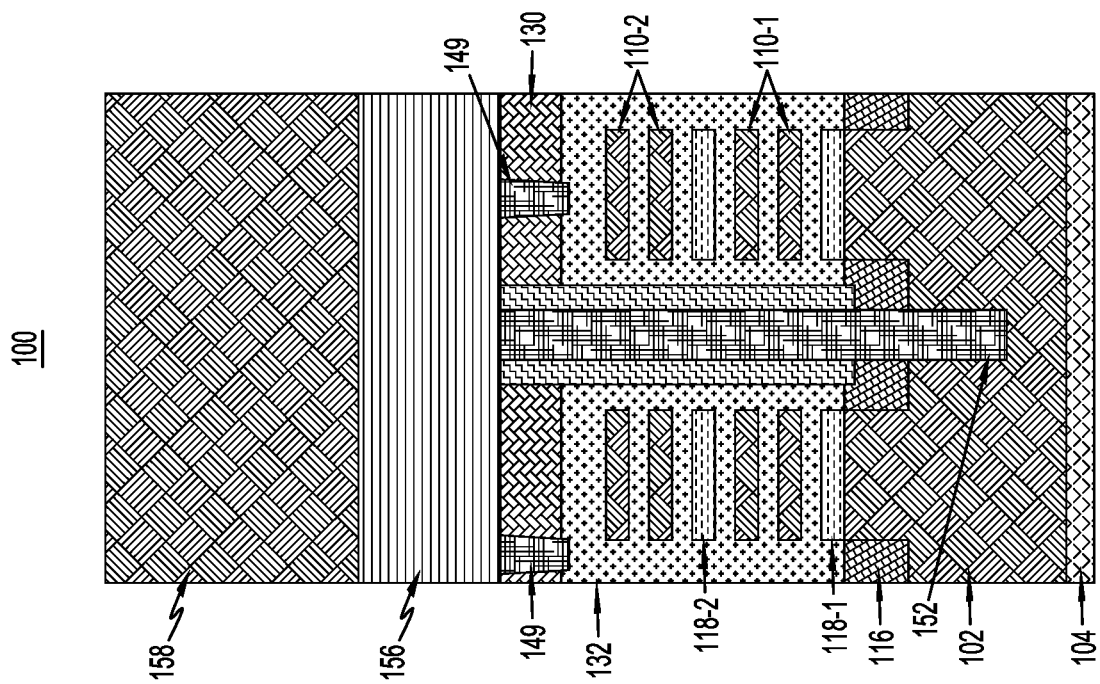
FIG. 10A is a cross-sectional view illustrating the semiconductor structure taken along the X-X axis of FIG. 1A at a tenth-intermediate fabrication stage, according to an illustrative embodiment.
Figure 10B:
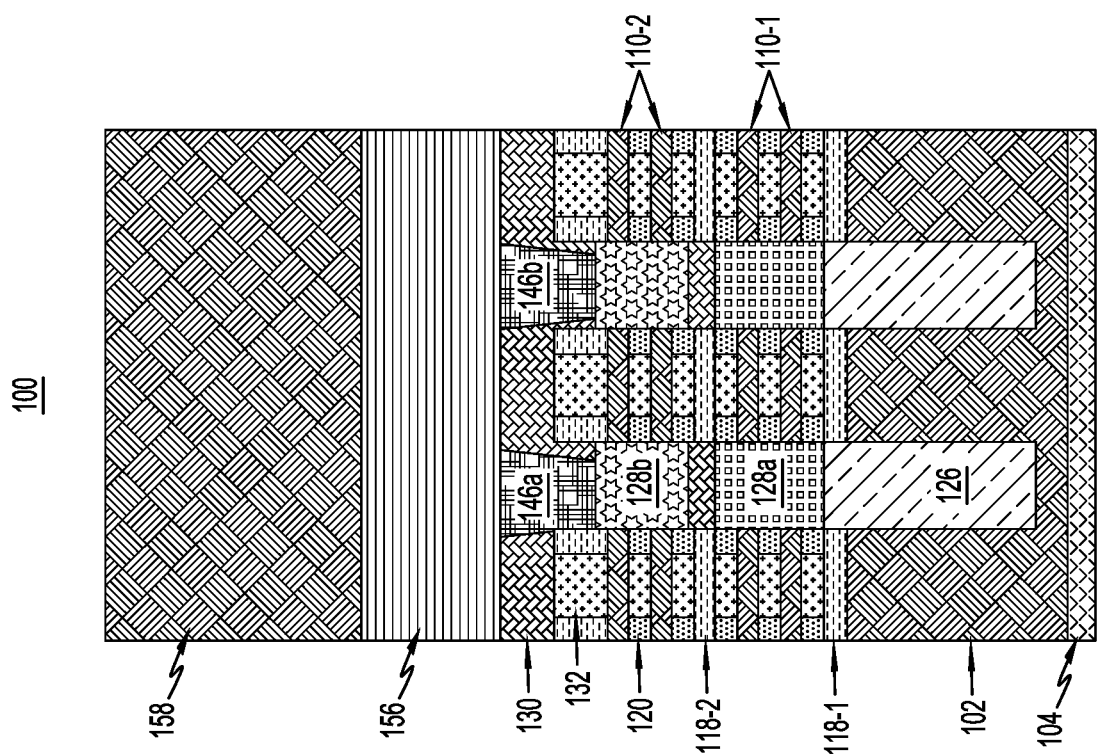
FIG. 10B is a cross-sectional view illustrating the semiconductor structure taken along the Y1-Y1 axis of FIG. 1A at the tenth-intermediate fabrication stage, according to an illustrative embodiment.
Figure 10C:
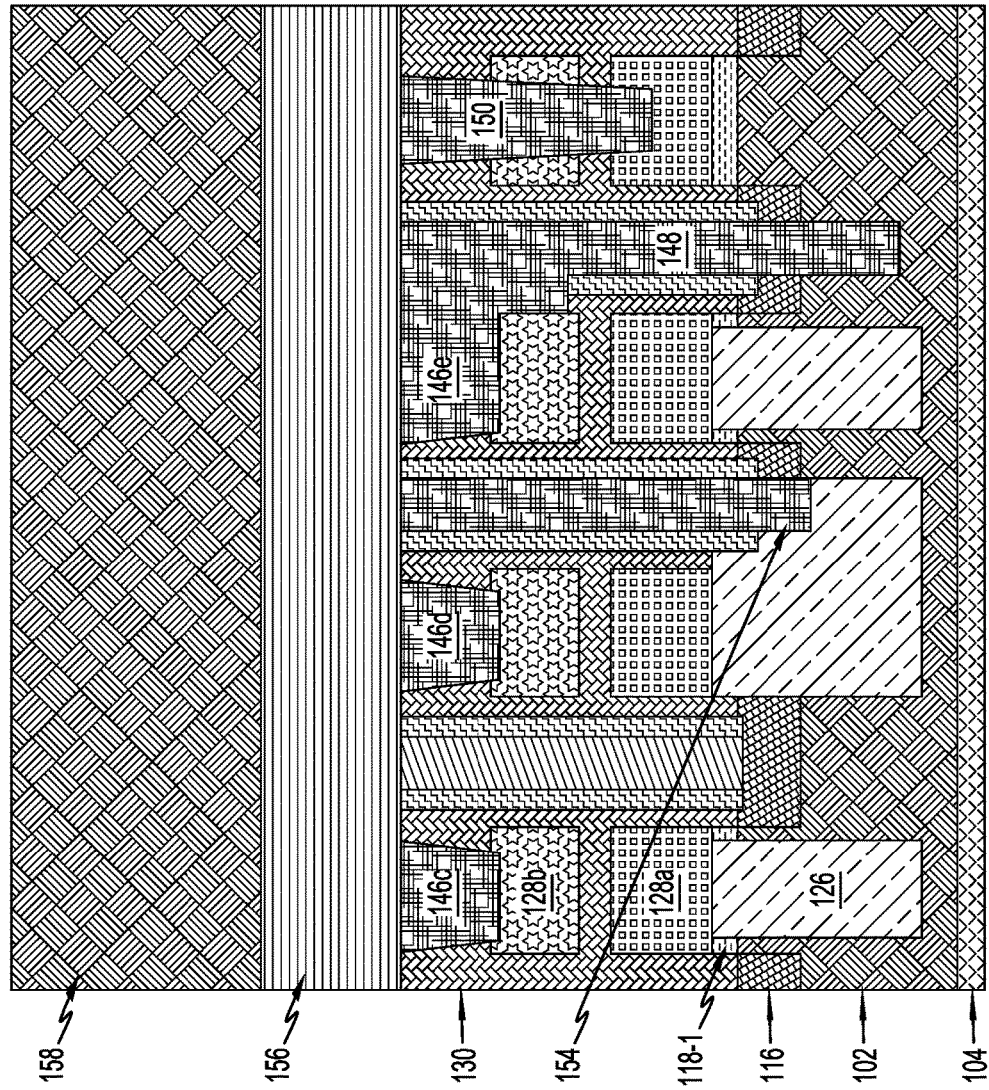
FIG. 10C is a cross-sectional view illustrating the semiconductor structure taken along the Y2-Y2 axis of FIG. 1A at the tenth-intermediate fabrication stage, according to an illustrative embodiment.

FIGS. 10A-10C illustrate semiconductor structure 100 at a tenth-intermediate fabrication stage. During this stage, portions of the substrate 102 may be removed from the backside using, for example, substrate grinding. CMP and a wet etch to selectively remove substrate 102 until the etch stop layer 104 is reached. This can be accomplished, for example, by flipping the semiconductor structure 100 over using the carrier wafer 158 so that the backside of the substrate 102 (i.e., the back surface) is facing up.

Figure 11A:
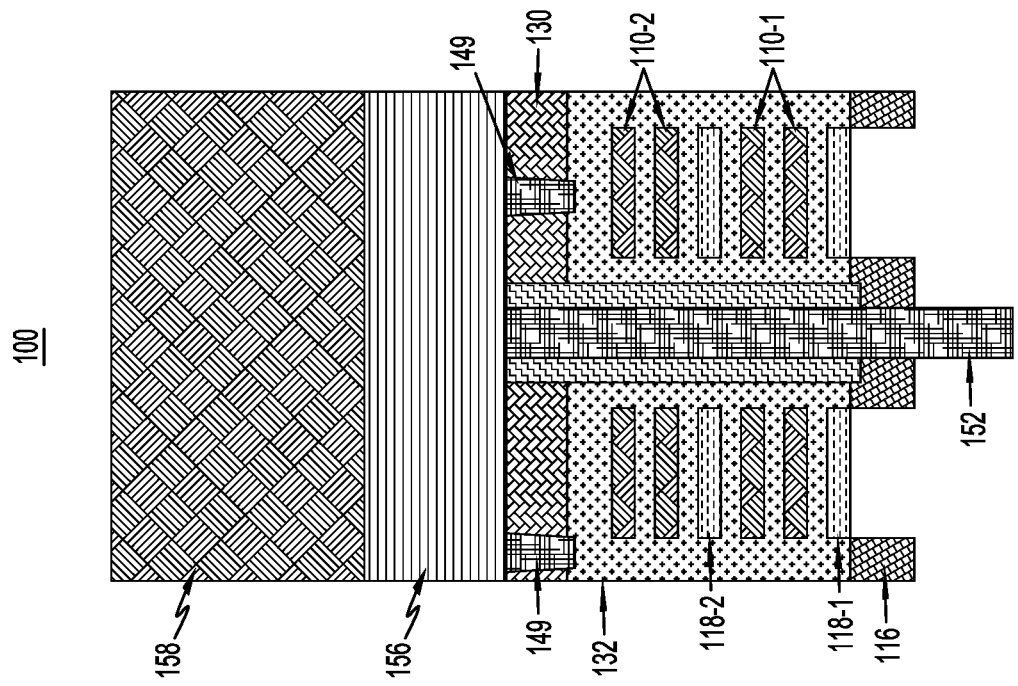
FIG. 11A is a cross-sectional view illustrating the semiconductor structure taken along the X-X axis of FIG. 1A at an eleventh-intermediate fabrication stage, according to an illustrative embodiment.
Figure 11B:
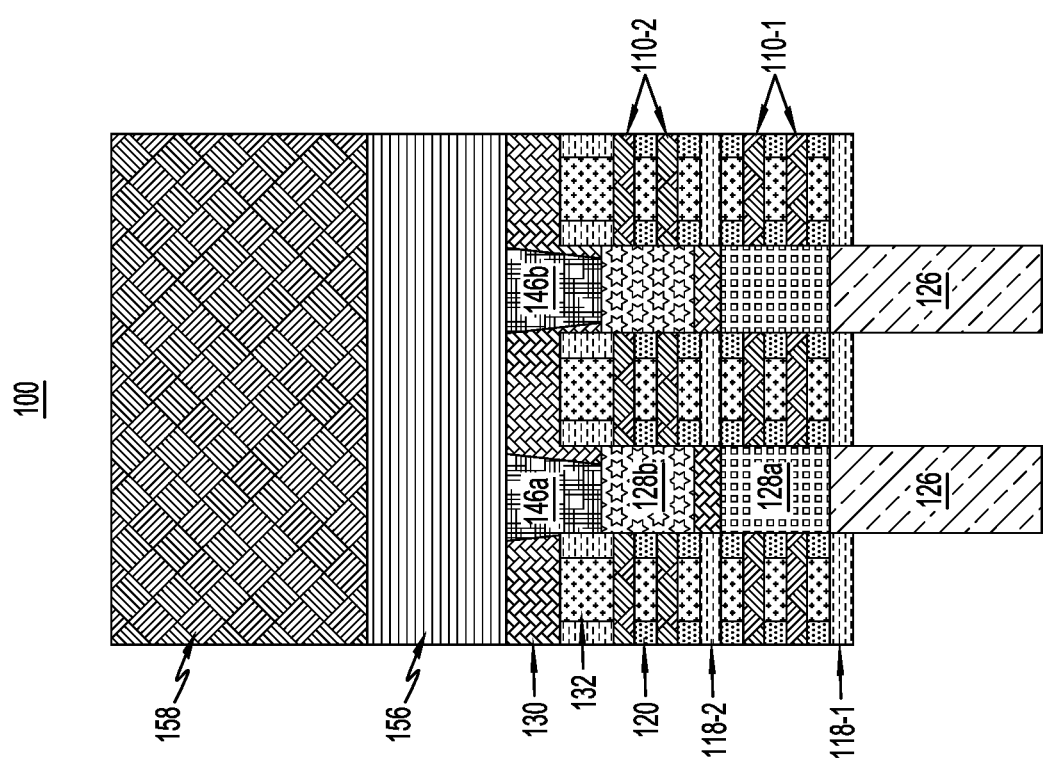
FIG. 11B is a cross-sectional view illustrating the semiconductor structure taken along the Y1-Y1 axis of FIG. 1A at the eleventh-intermediate fabrication stage, according to an illustrative embodiment.
Figure 11C:
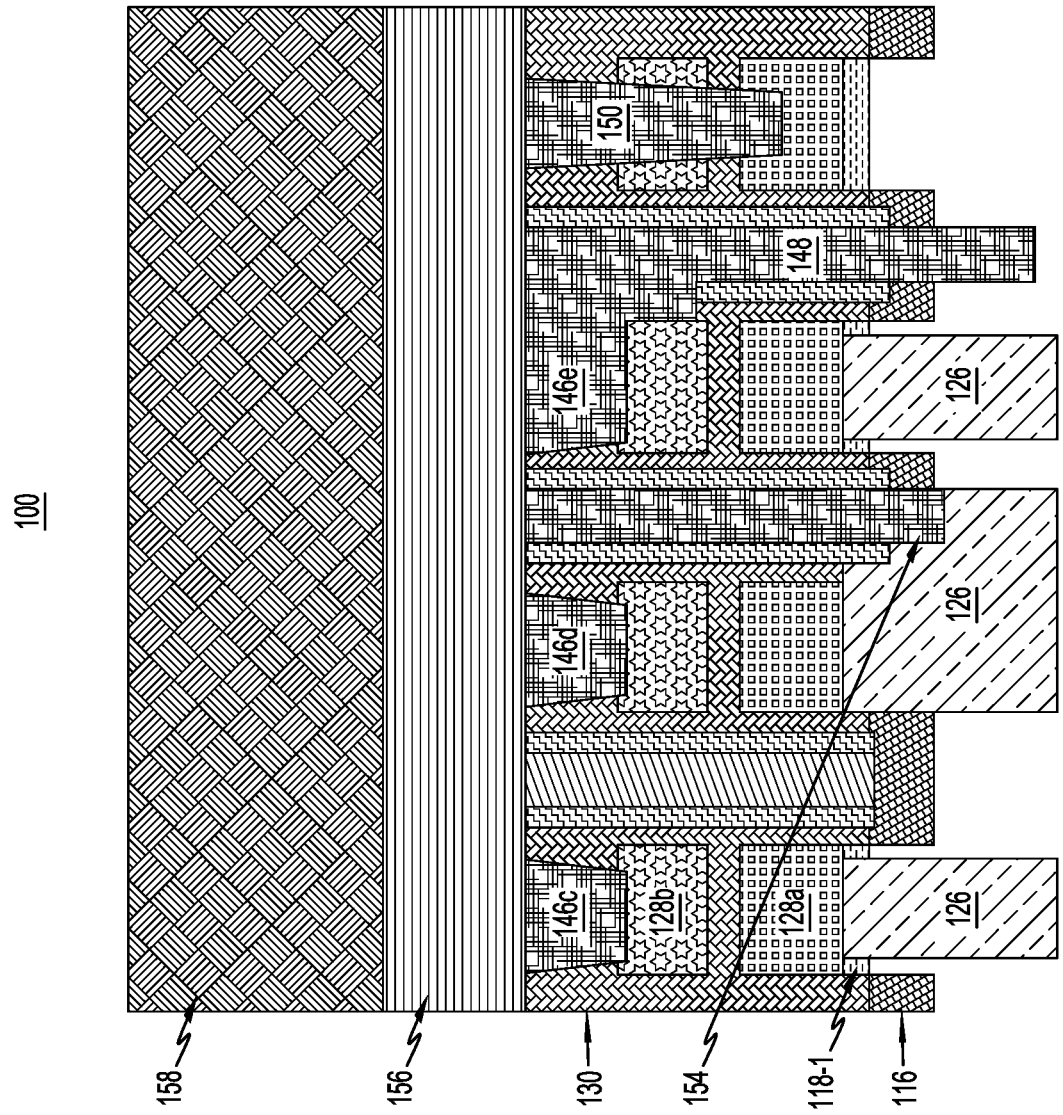
FIG. 11C is a cross-sectional view illustrating the semiconductor structure taken along the Y2-Y2 axis of FIG. 1A at the eleventh-intermediate fabrication stage, according to an illustrative embodiment.

FIGS. 11A-11C illustrate semiconductor structure 100 at an eleventh-intermediate fabrication stage. During this stage, the etch stop layer 104 is selectively removed using, for example, a wet etch to selectively remove etch stop layer 104 until substrate 102 is reached. Next, the remaining portions of the substrate 102 are removed to expose BDI layer 118-1. STI region 116, sacrificial placeholders 126, metal via 148 and MOL contact 152. The remaining portions of the substrate 102 can be removed utilizing a selective etch process such as a wet etch.

Figure 12B:
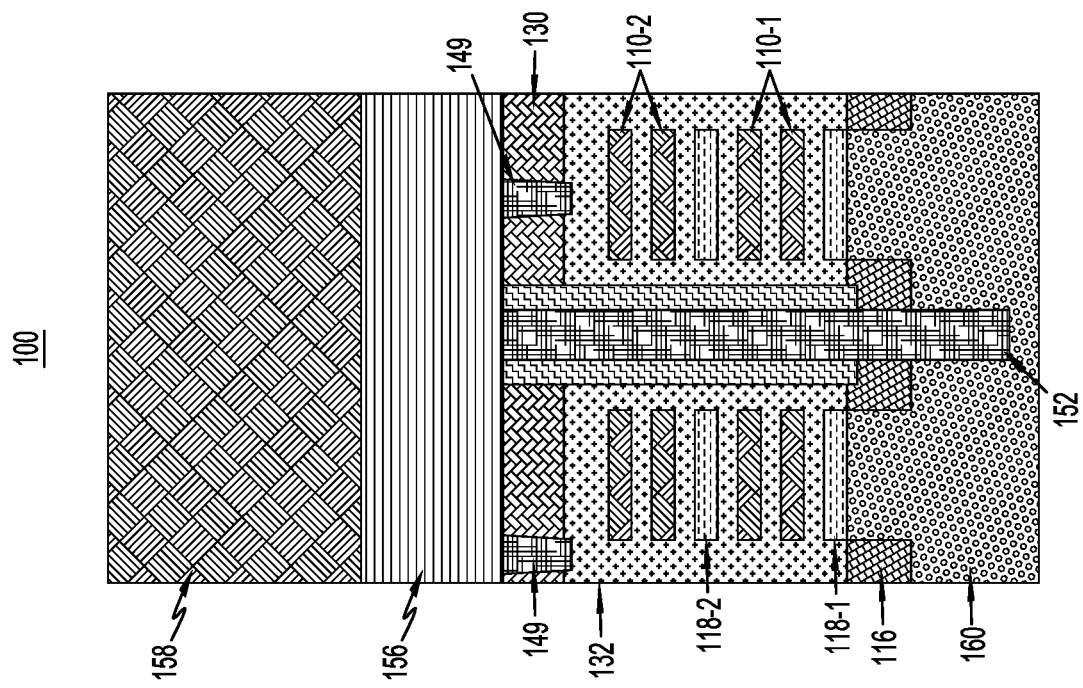
FIG. 12B is a cross-sectional view illustrating the semiconductor structure taken along the Y1-Y1 axis of FIG. 1A at the twelfth-intermediate fabrication stage, according to an illustrative embodiment.
Figure 12A:
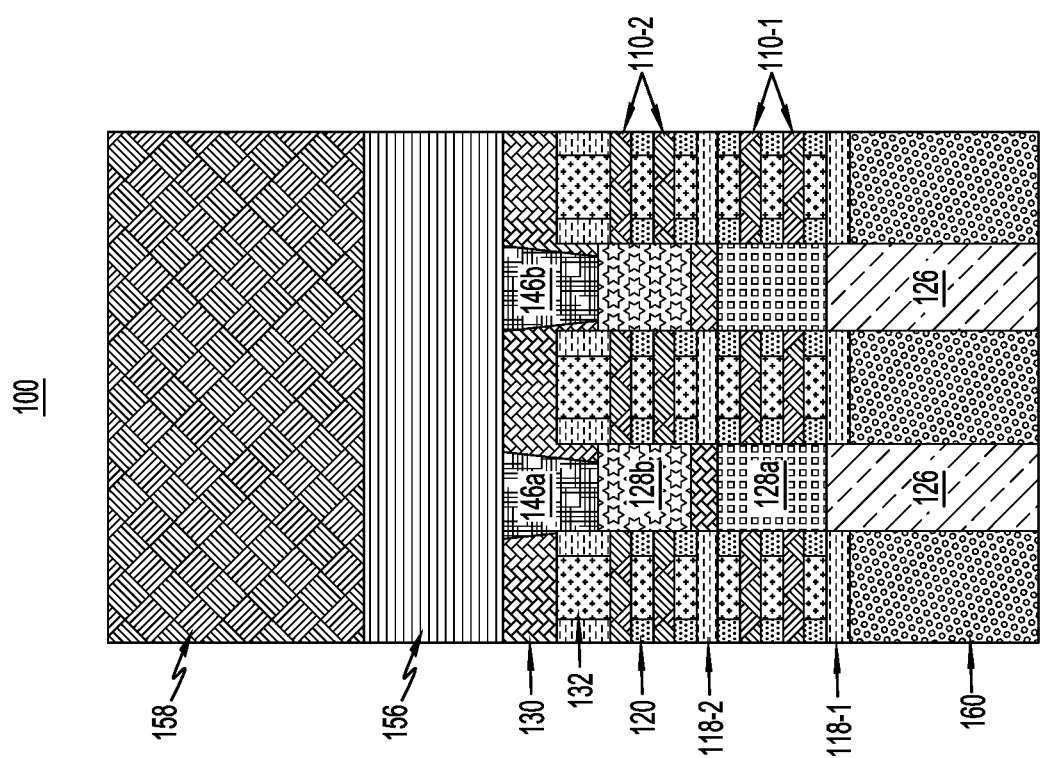
FIG. 12A is a cross-sectional view illustrating the semiconductor structure taken along the X-X axis of FIG. 1A at a twelfth-intermediate fabrication stage, according to an illustrative embodiment.
Figure 12C:
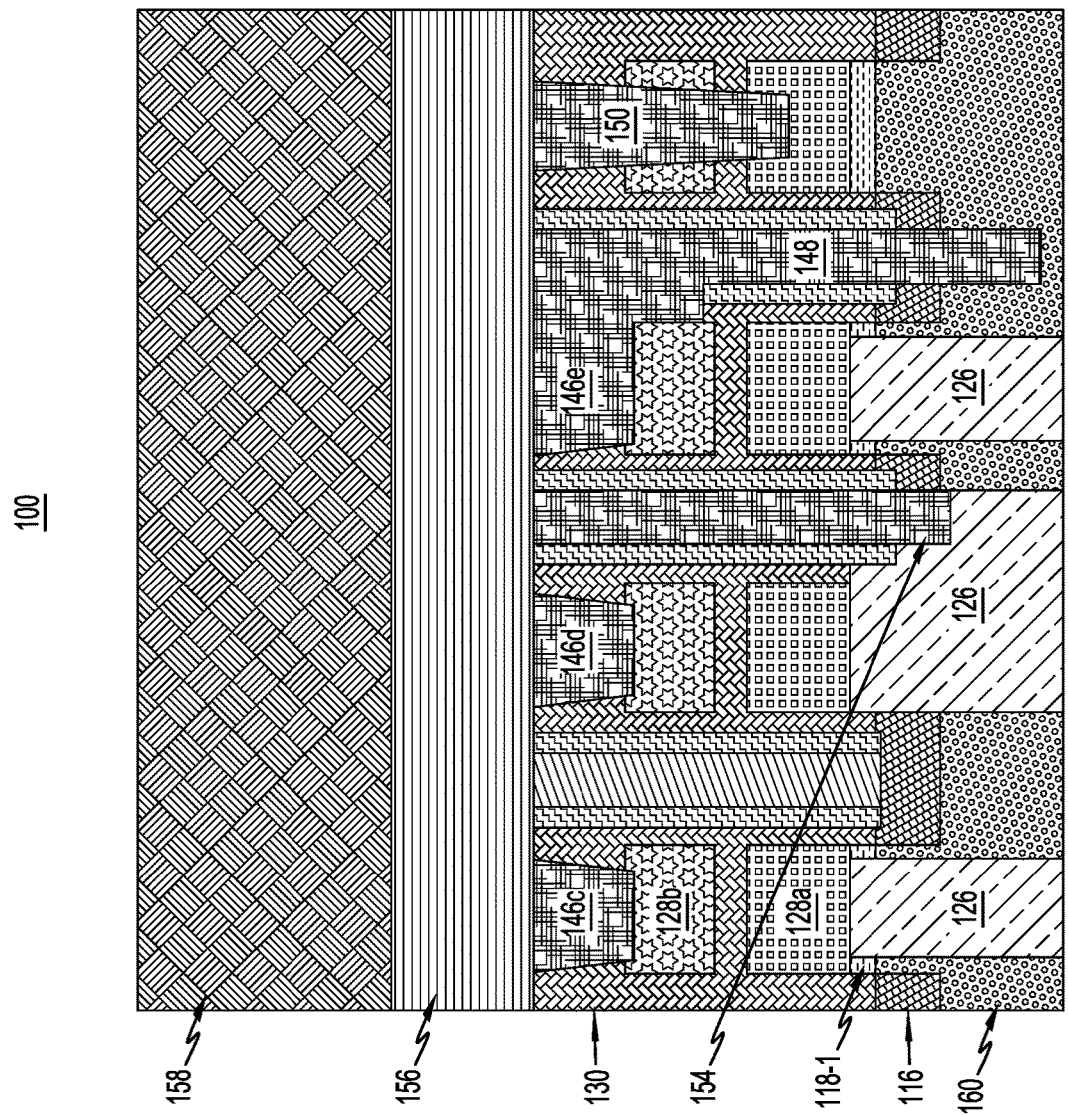
FIG. 12C is a cross-sectional view illustrating the semiconductor structure taken along the Y2-Y2 axis of FIG. 1A at the twelfth-intermediate fabrication stage, according to an illustrative embodiment.

FIGS. 12A-12C illustrate semiconductor structure 100 at a twelfth-intermediate fabrication stage. During this stage, backside ILD layer 160 may be formed of similar materials and similar processes as ILD layer 130. The material of the backside ILD layer 160 may initially be overfilled, followed by planarization (e.g., using CMP).

Figure 13B:
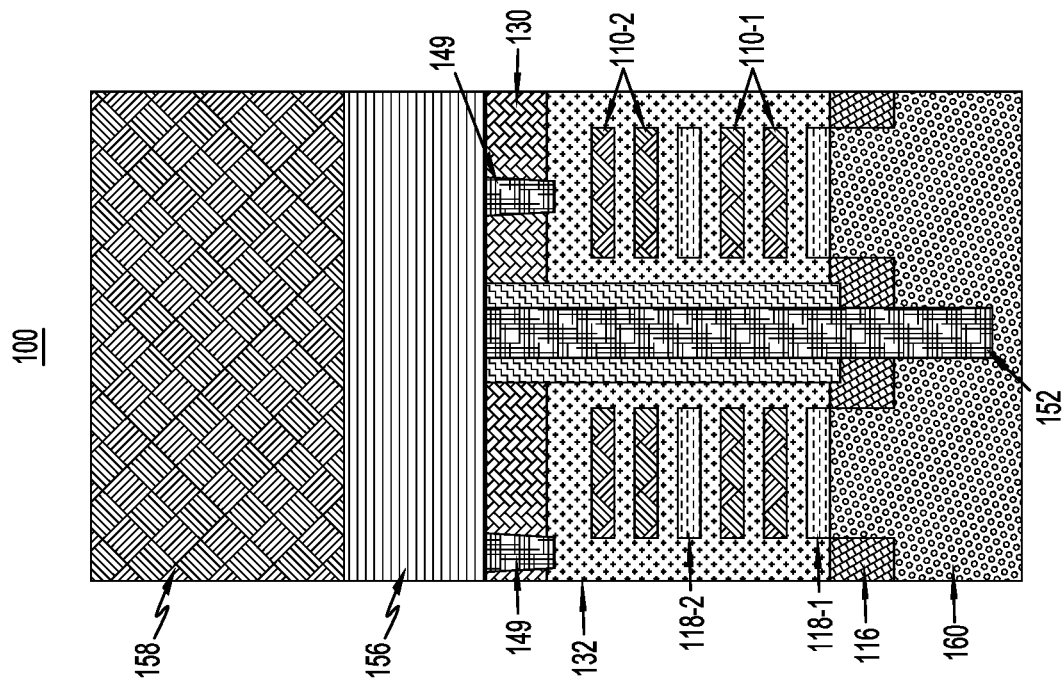
FIG. 13B is a cross-sectional view illustrating the semiconductor structure taken along the Y1-Y1 axis of FIG. 1A at the thirteenth-intermediate fabrication stage, according to an illustrative embodiment.
Figure 13A:
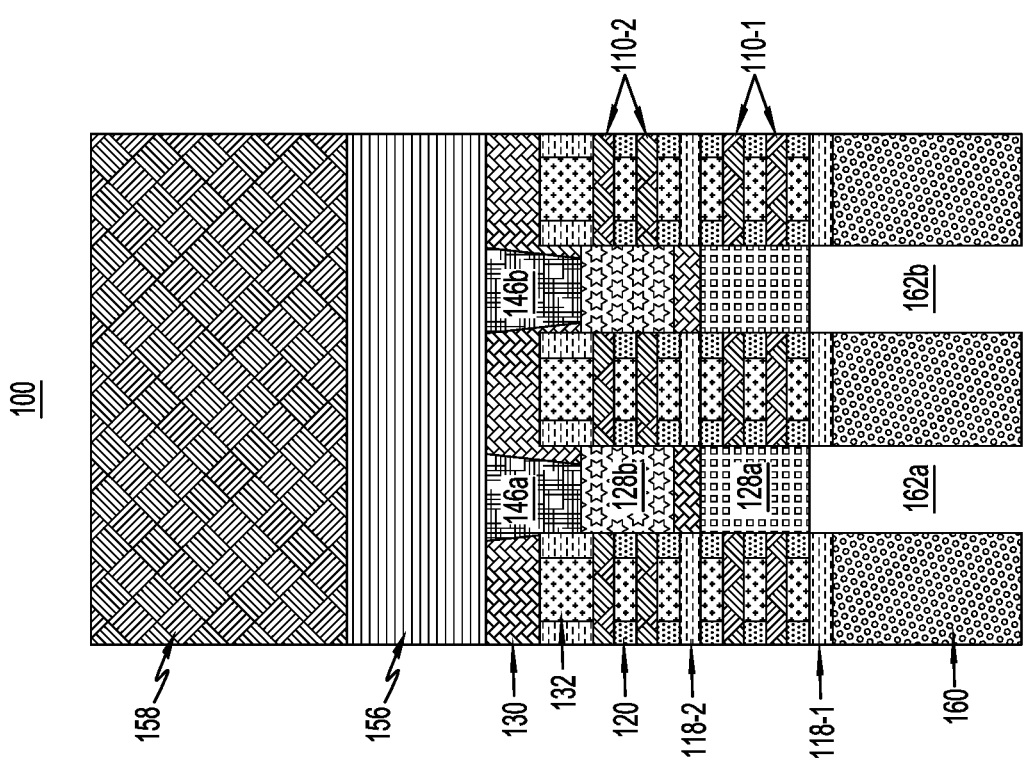
FIG. 13A is a cross-sectional view illustrating the semiconductor structure taken along the X-X axis of FIG. 1A at a thirteenth-intermediate fabrication stage, according to an illustrative embodiment.
Figure 13C:
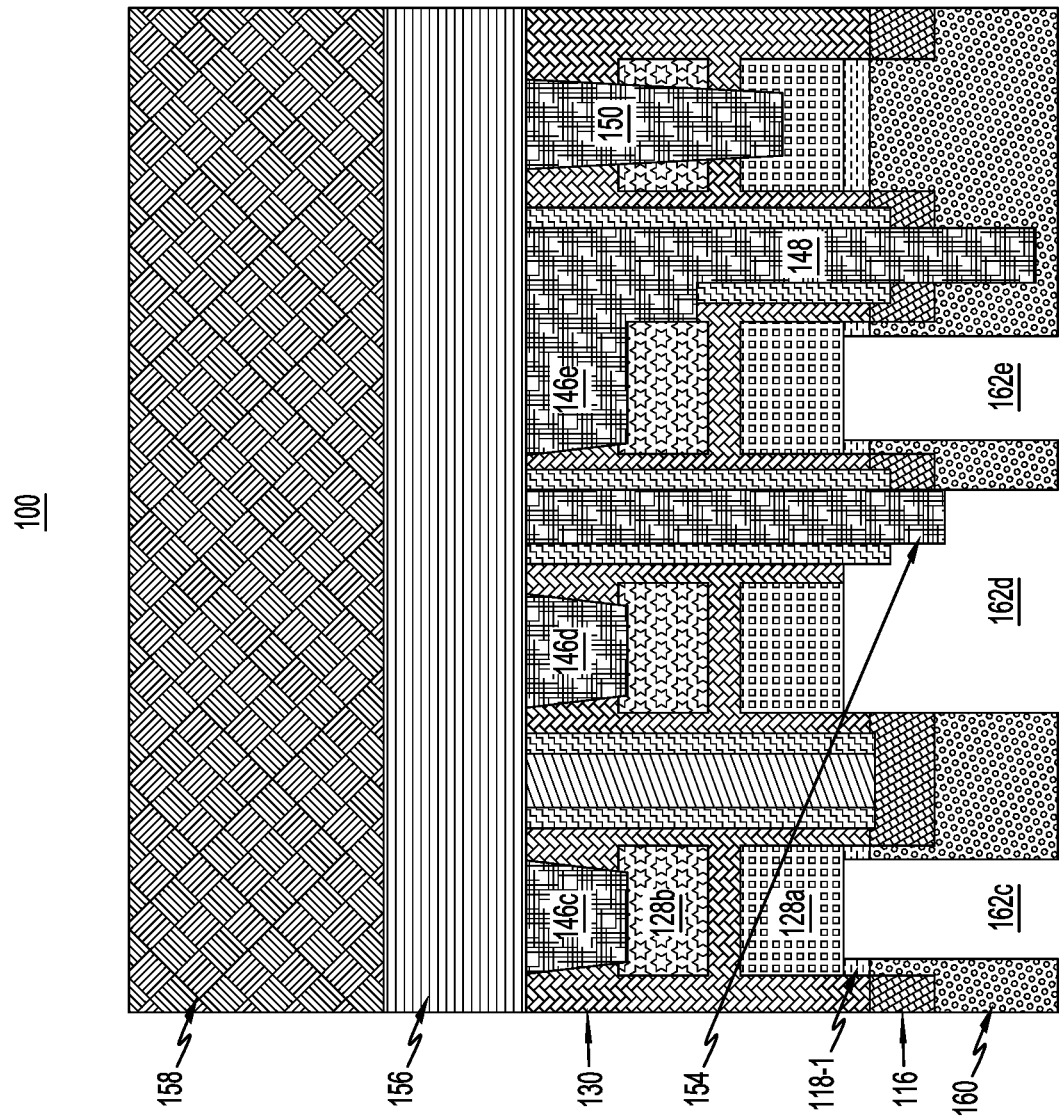
FIG. 13C is a cross-sectional view illustrating the semiconductor structure taken along the Y2-Y2 axis of FIG. 1A at the thirteenth-intermediate fabrication stage, according to an illustrative embodiment.

FIGS. 13A-13C illustrate semiconductor structure 100 at a thirteenth-intermediate fabrication stage. During this stage, sacrificial placeholders 126 are selectively removed to form openings 162a, 162b, 162c, 162d, and 162e using any suitable etch processing that removes the material of the sacrificial placeholders 126 selective to that of the rest of the structure. A suitable etching process includes, for example, a wet etch.

Figure 14A:
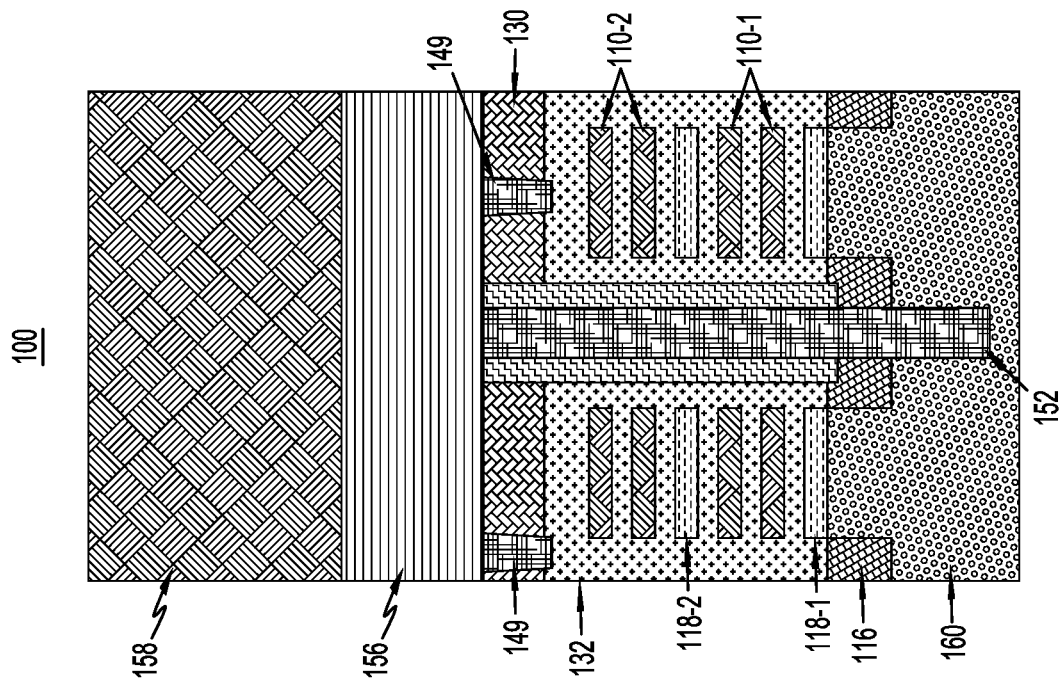
FIG. 14A is a cross-sectional view illustrating the semiconductor structure taken along the X-X axis of FIG. 1A at a fourteenth-intermediate fabrication stage, according to an illustrative embodiment.
Figure 14B:
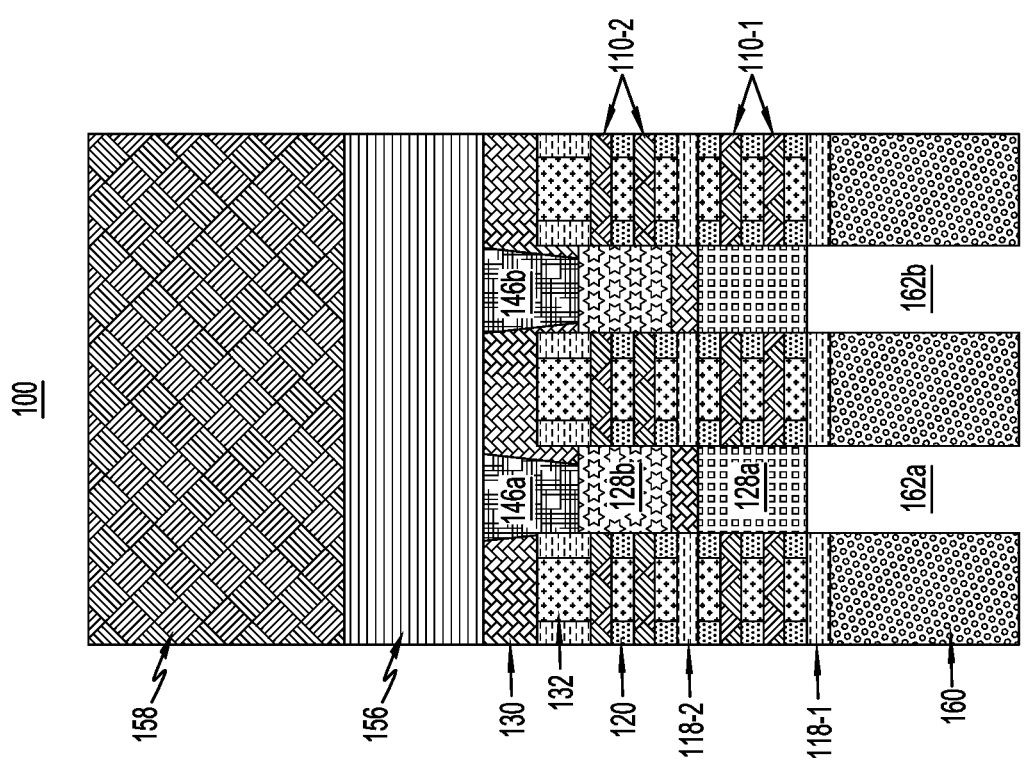
FIG. 14B is a cross-sectional view illustrating the semiconductor structure taken along the Y1-Y1 axis of FIG. 1A at the fourteenth-intermediate fabrication stage, according to an illustrative embodiment.
Figure 14C:
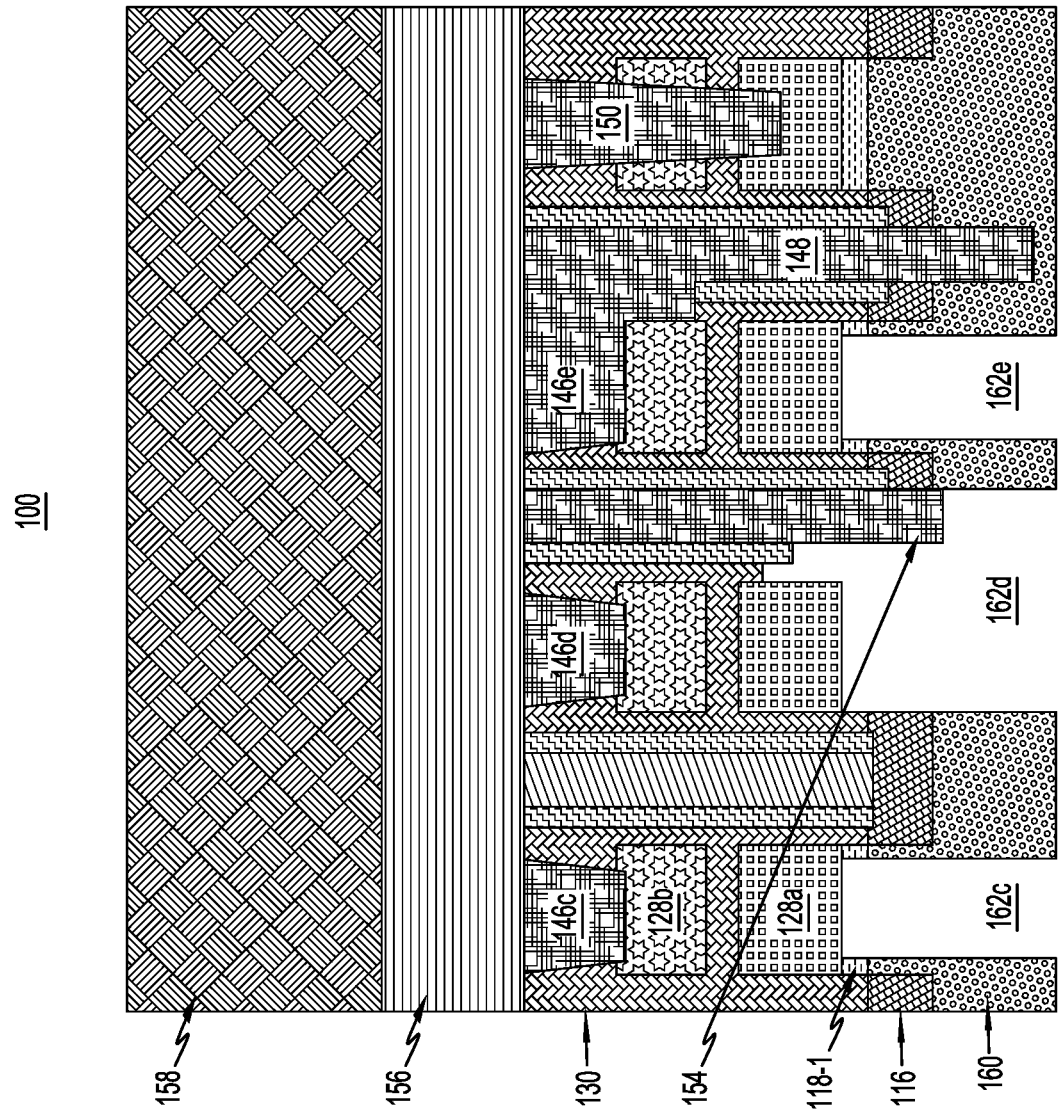
FIG. 14C is a cross-sectional view illustrating the semiconductor structure taken along the Y2-Y2 axis of FIG. 1A at the fourteenth-intermediate fabrication stage, according to an illustrative embodiment.

FIGS. 14A-14C illustrate semiconductor structure 100 at a fourteenth-intermediate fabrication stage. During this stage, the exposed sidewall spacer 136 and ILD layer 130 in opening 162d is selectively removed using an etching process such as RIE to expose at least a portion of a sidewall of bottom source/drain regions 128a (see FIG. 14C). As discussed above, by using different materials for BDI layer 118-1 and sidewall spacers 136, the etching process can selectively remove sidewall spacers 136 relative to BDI layer 118-1 to protect the replacement gate 132 in opening 162c while exposing a top surface and sidewall of respective bottom source/drain region 128a in opening 162d.

Figure 15B:
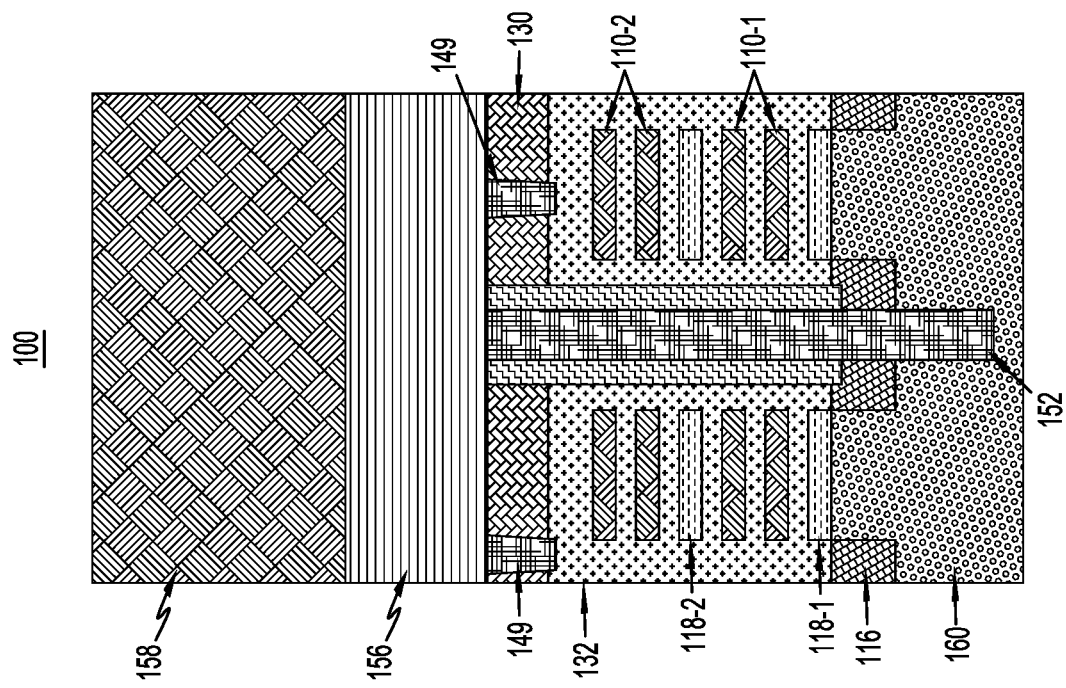
FIG. 15B is a cross-sectional view illustrating the semiconductor structure taken along the Y1-Y1 axis of FIG. 1A at the fifteenth-intermediate fabrication stage, according to an illustrative embodiment.
Figure 15A:
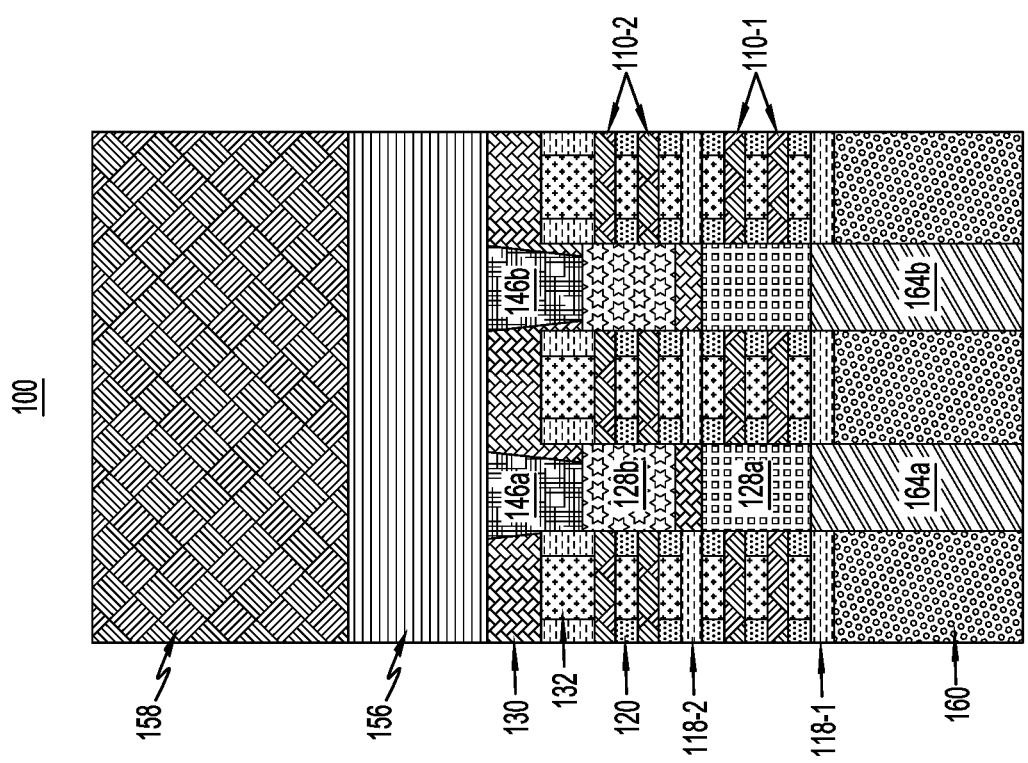
FIG. 15A is a cross-sectional view illustrating the semiconductor structure taken along the X-X axis of FIG. 1A at a fifteenth-intermediate fabrication stage, according to an illustrative embodiment.
Figure 15C:
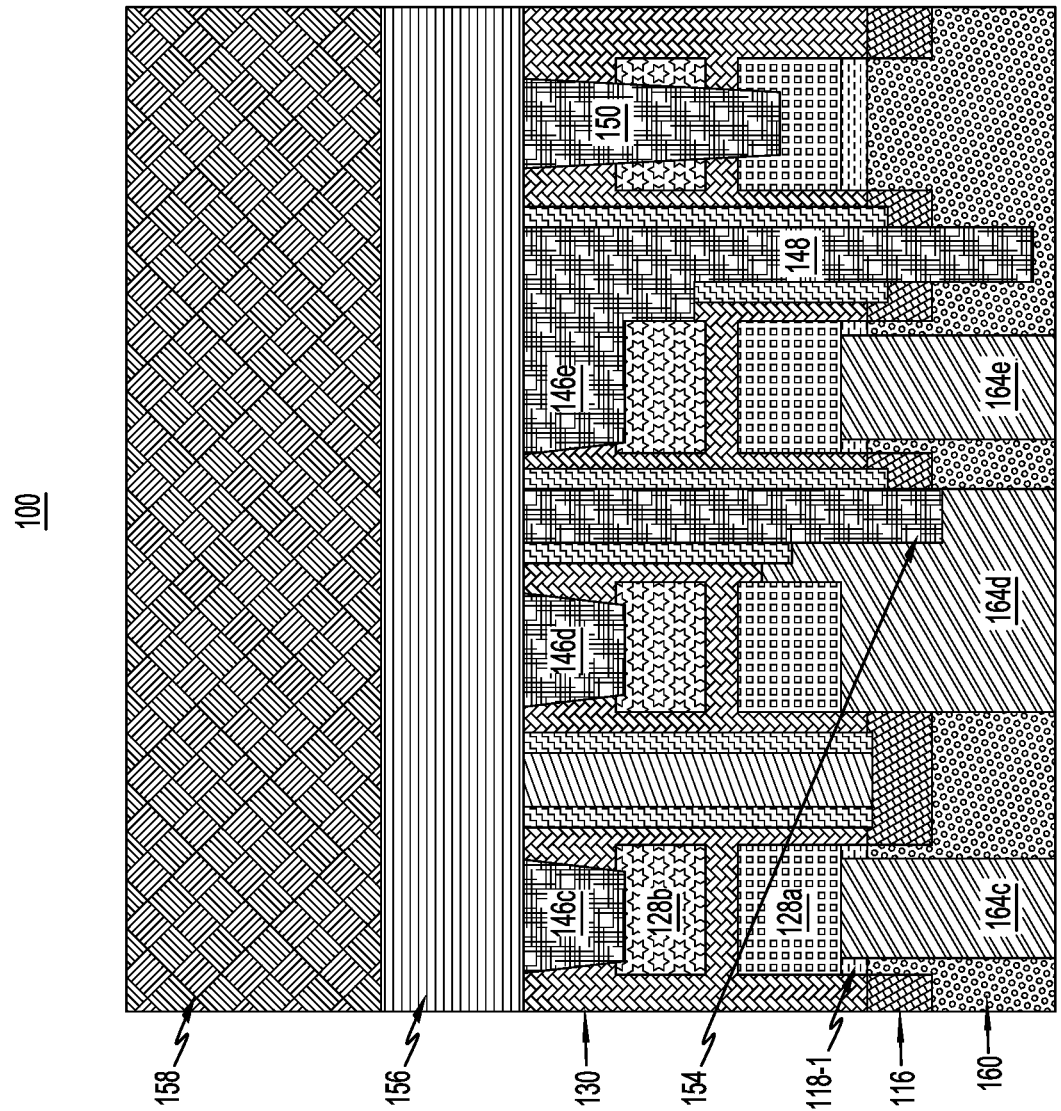
FIG. 15C is a cross-sectional view illustrating the semiconductor structure taken along the Y2-Y2 axis of FIG. 1A at the fifteenth-intermediate fabrication stage, according to an illustrative embodiment.

FIGS. 15A-15C illustrate semiconductor structure 100 at a fifteenth-intermediate fabrication stage. During this stage, a suitable conductive metal is then deposited in openings 162a, 162b, 162c, 162d, and 162e, followed by CMP to remove any metal on top of backside ILD layer 160 to form bottom source/drain contacts 164a, 164b, 164c, 164d, and 164c. Bottom source/drain contact 164d is partially disposed on a sidewall and bottom surface of bottom source/drain regions 128a. Thus, bottom source/drain contact 164d can also be referred to as partially wrapped-around backside bottom source/drain contact 164d. A suitable conductive metal can be any of the metals discussed above.

Figure 16A:
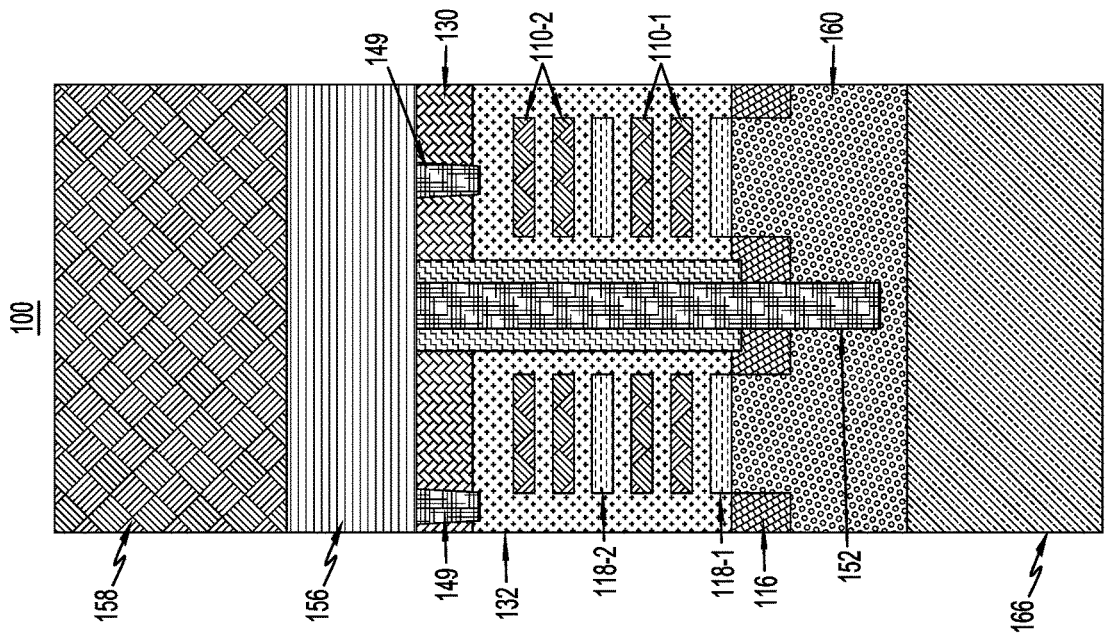
FIG. 16A is a cross-sectional view illustrating the semiconductor structure taken along the X-X axis of FIG. 1A at a thirteenth-intermediate fabrication stage, according to an illustrative embodiment.
Figure 16B:
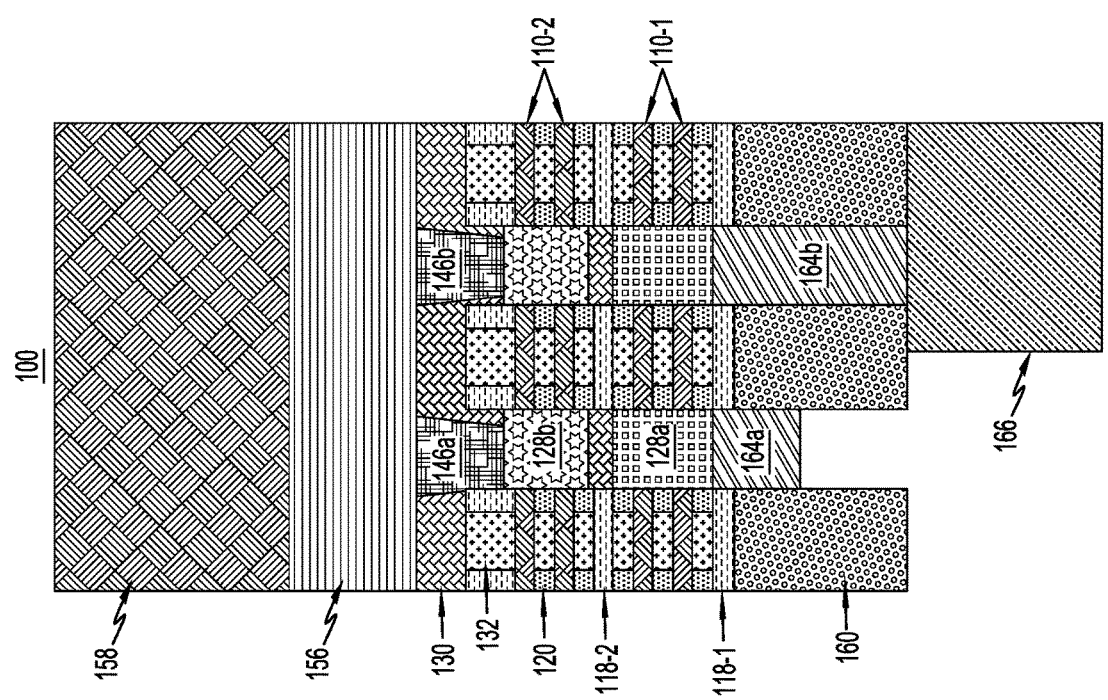
FIG. 16B is a cross-sectional view illustrating the semiconductor structure taken along the Y1-Y1 axis of FIG. 1A at the sixteenth-intermediate fabrication stage, according to an illustrative embodiment.
Figure 16C:
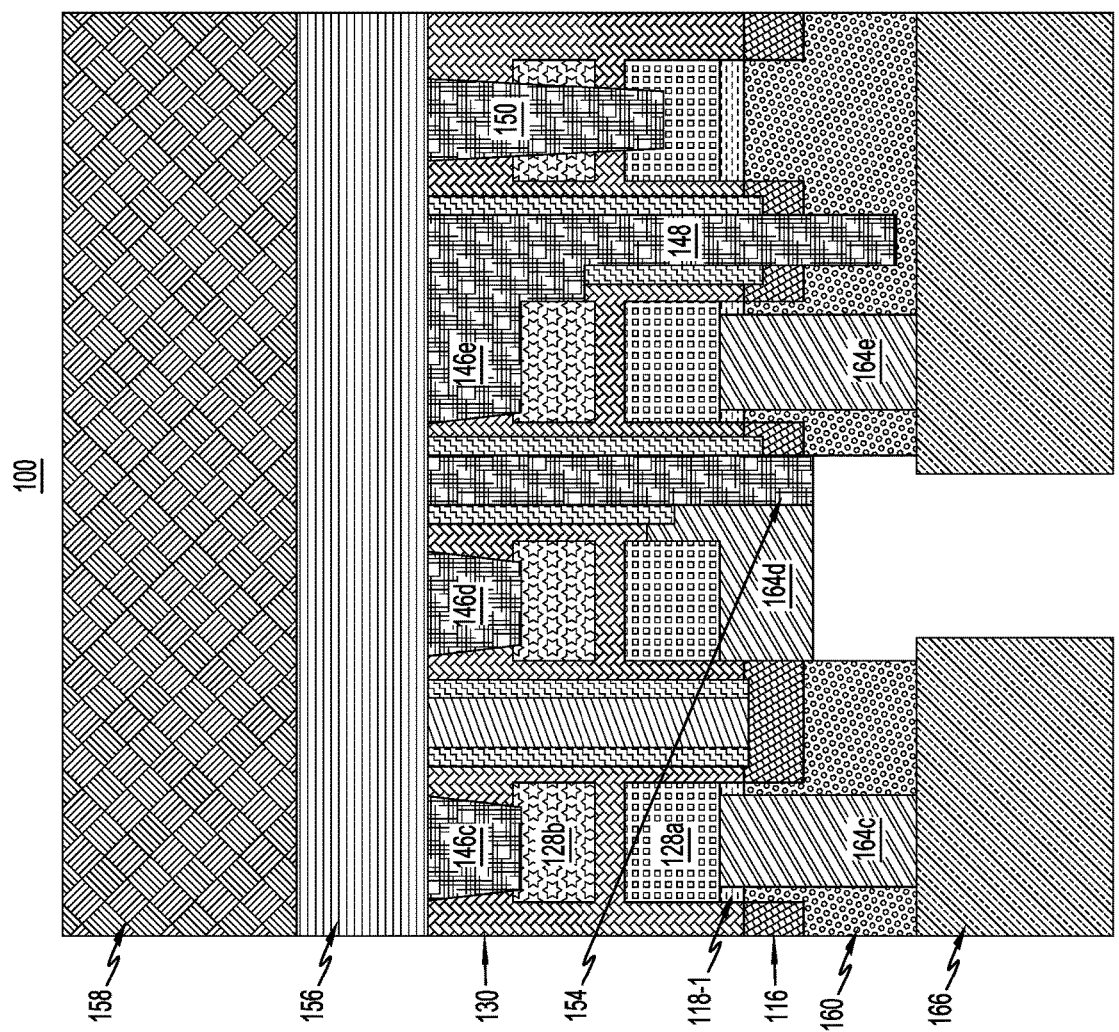
FIG. 16C is a cross-sectional view illustrating the semiconductor structure taken along the Y2-Y2 axis of FIG. 1A at the sixteenth-intermediate fabrication stage, according to an illustrative embodiment.

FIGS. 16A-16C illustrate semiconductor structure 100 at a sixteenth-intermediate fabrication stage. During this stage, a bottom source/drain contacts 164a and 164d are selectively recessed by first forming a mask layer 166 over semiconductor structure 100. Mask layer 166 can be formed of similar material and similar processes as mask layer 124. Next, the mask layer 166 is patterned and then etched to recess bottom source/drain contacts 164a and 164d using, for example, RIE, and form an opening in the mask layer 166.

Figure 17A:
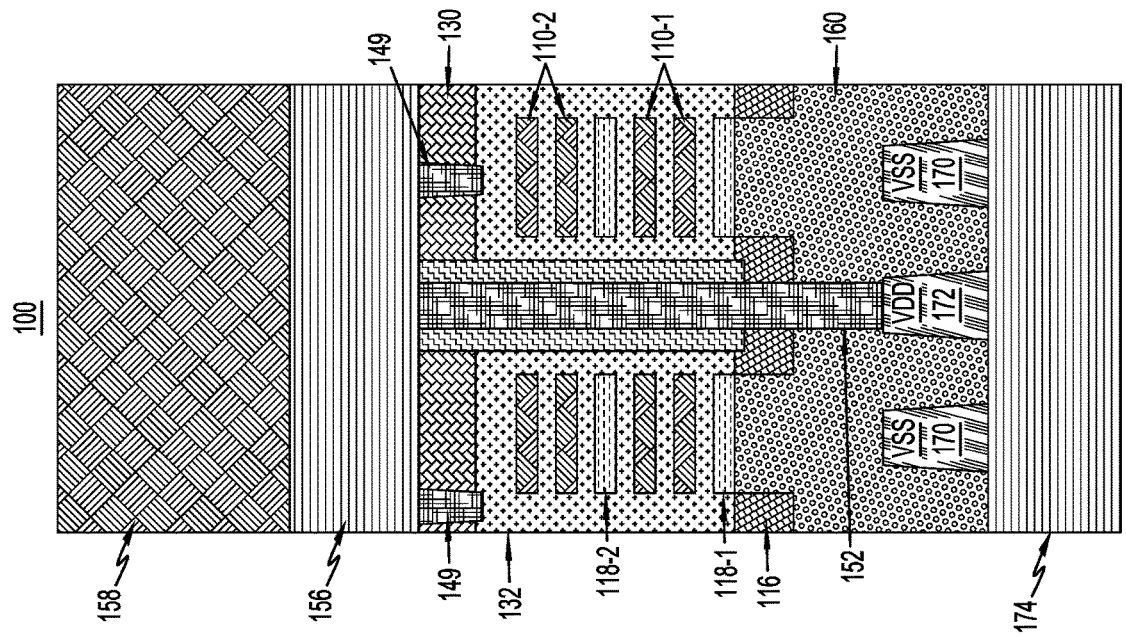
FIG. 17A is a cross-sectional view illustrating the semiconductor structure taken along the X-X axis of FIG. 1A at a seventeenth-intermediate fabrication stage, according to an illustrative embodiment.
Figure 17B:
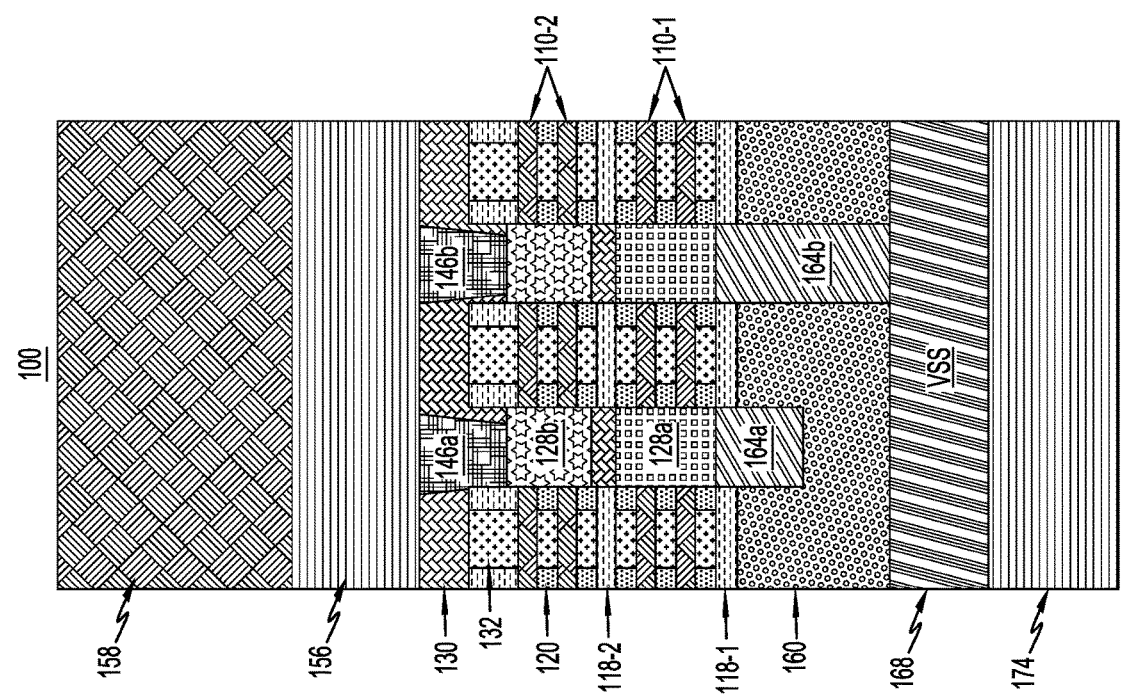
FIG. 17B is a cross-sectional view illustrating the semiconductor structure taken along the Y1-Y1 axis of FIG. 1A at the seventeenth-intermediate fabrication stage, according to an illustrative embodiment.
Figure 17C:
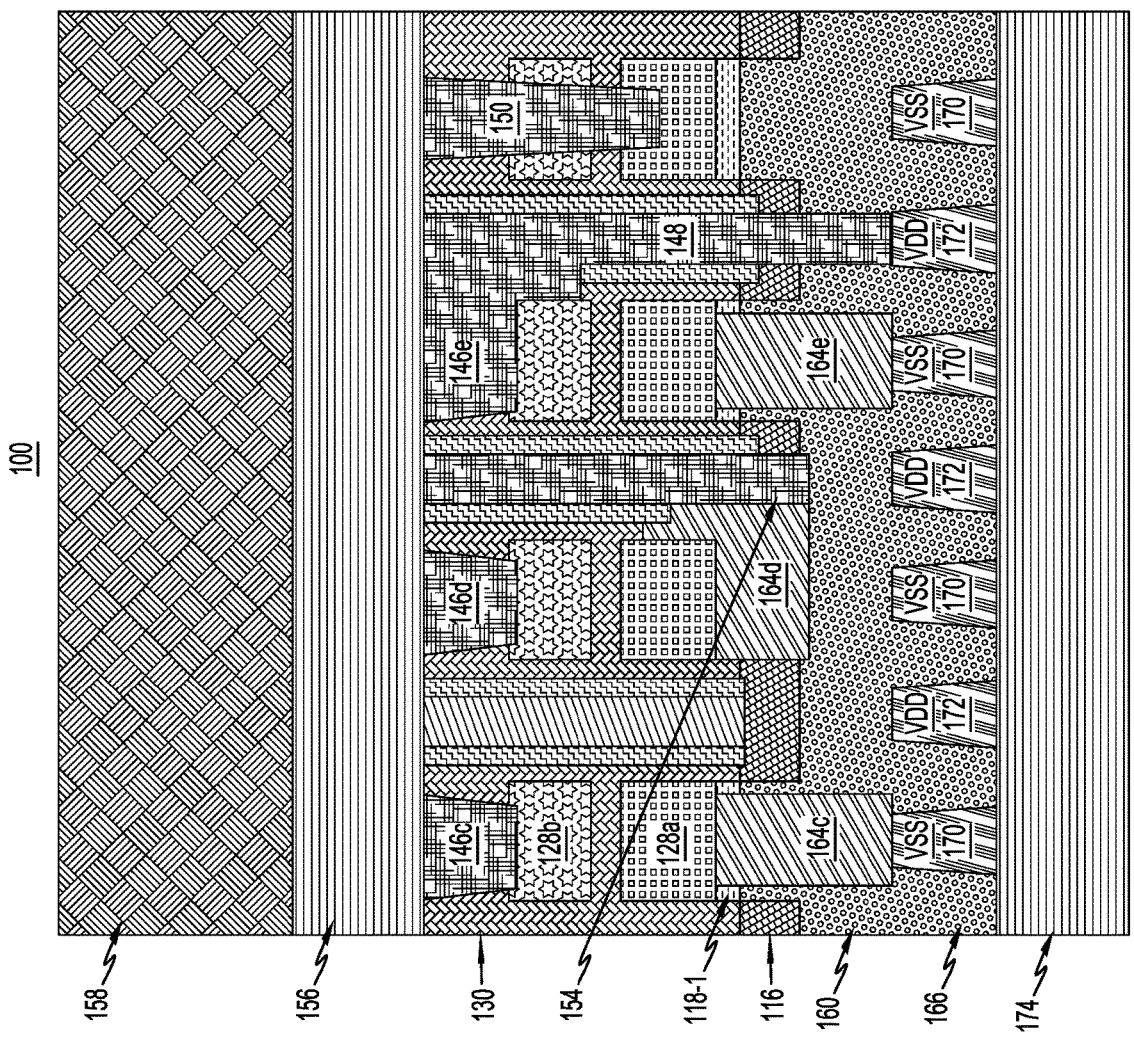
FIG. 17C is a cross-sectional view illustrating the semiconductor structure taken along the Y2-Y2 axis of FIG. 1A at the seventeenth-intermediate fabrication stage, according to an illustrative embodiment.

FIGS. 17A-17C illustrate semiconductor structure 100 at a seventeenth-intermediate fabrication stage. During this stage, additional backside ILD layer 160 is formed on semiconductor structure 100, followed by forming backside power rail 168 by depositing a suitable conductive metal on backside ILD layer 160. The conductive metal may include, but is not limited to, tungsten, copper, aluminum, silver, gold and alloys thereof.

Backside ground (GND or Vss) rails 170 to provide a series of power supplies, and backside power (Vdd) rails 172 to provide supply voltage to the structure are formed by utilizing conventional lithographic and etching processes such as RIE in backside ILD layer 160 to create openings followed by depositing a suitable conductive metal in the openings.

Next, backside power delivery network 174 is formed over the semiconductor structure 100 including backside power rail 168, ground (GND or Vss) rails 170 and backside power (Vdd) rails 172 and is based on creation of a wiring scheme that is disposed on both sides of the device layer (front end of line structure).

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOSs, MOSFETS, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
   a stacked device structure comprising:
      a first field-effect transistor comprising a first source/drain region;
      a second field-effect transistor vertically stacked above the first field-effect transistor, the second field-effect transistor comprising a second source/drain region and a gate region having first sidewall spacers;
      a frontside source/drain contact disposed on a first portion of a sidewall and a top surface of the second source/drain region;
      a first metal via connected to the frontside source/drain contact and to a first backside power line; and
      second sidewall spacers disposed on a first portion of the first metal via;
      wherein a vertical sidewall of the first metal via is separated from the first source/drain region by the second sidewall spacers;
      wherein the first sidewall spacers comprise a first dielectric material and the second sidewall spacers comprise a second dielectric material different than the first dielectric material.

2. The semiconductor structure of claim 1, further comprising a bottom dielectric insulator layer disposed on a first portion of a bottom surface of the first source/drain region.

3. The semiconductor structure of claim 2, wherein the bottom dielectric insulator layer comprises a third dielectric material different than the second dielectric material.

4. The semiconductor structure of claim 2, wherein a second portion of the first metal via is disposed in an interlevel dielectric layer.

5. The semiconductor structure of claim 2, further comprising a backside metal contact disposed on a second portion of the bottom surface of the first source/drain region and connected to a second backside power line.

6. The semiconductor structure of claim 1, further comprising:
another stacked device structure adjacent the stacked device structure comprising:
a third field-effect transistor comprising a third source/drain region;
a fourth field-effect transistor vertically stacked above the third field-effect transistor, the fourth field-effect transistor comprising a fourth source/drain region;
a backside source/drain contact disposed on a second portion of a sidewall and a bottom surface of the third source/drain region; and
a second metal via connected to the backside source/drain contact and to a back-end-of-the-line layer.

7. The semiconductor structure of claim 6, further comprising a backside metal contact disposed on a bottom surface of the first source/drain region and connected to a second backside power line.

8. The semiconductor structure of claim 1, wherein the frontside source/drain contact is further disposed on a back-end-of-the-line layer.

9. A semiconductor structure, comprising:
a first stacked device structure comprising:
a first field-effect transistor comprising a first source/drain region;
a second field-effect transistor vertically stacked above the first field-effect transistor, the second field-effect transistor comprising a second source/drain region;
a frontside source/drain contact disposed on a first portion of a sidewall and a top surface of the second source/drain region; and
a first metal via connected to the frontside source/drain contact and to a first backside power line; and
a second stacked device structure adjacent the first stacked device structure comprising:
a third field-effect transistor comprising a third source/drain region;
a fourth field-effect transistor vertically stacked above the third field-effect transistor, the fourth field-effect transistor comprising a fourth source/drain region;
a first backside source/drain contact disposed on a second portion of a sidewall and a bottom surface of the third source/drain region;
a second metal via connected to the first backside source/drain contact and to a back-end-of-the-line layer;
a bottom dielectric insulator layer disposed on another portion of the bottom surface of the third source/drain region;
a first sidewall spacer and a second sidewall spacer disposed on opposing sidewalls of the first stacked device structure and the second stacked device structure; and
a dielectric fill disposed between the first sidewall spacer and the second sidewall spacer.

10. The semiconductor structure of claim 9, wherein the first backside source/drain contact is further disposed on an interlayer dielectric layer.

11. The semiconductor structure of claim 9, wherein the bottom dielectric insulator layer comprises a first dielectric material, and the first and second sidewall spacers comprise a second dielectric material different than the first dielectric material.

12. The semiconductor structure of claim 11, wherein the dielectric fill comprises a third dielectric material different than the first dielectric material and the second dielectric material.

13. The semiconductor structure of claim 9, further comprising a second backside source/drain contact disposed on the first source/drain region and connected to a second backside power line.

14. A semiconductor structure, comprising:
a first stacked transistor comprising:
a first nanosheet field-effect transistor disposed on a first bottom dielectric insulator layer, the first nanosheet field-effect transistor comprising a first gate structure; and
a second nanosheet field-effect transistor device stacked above the first nanosheet field-effect transistor, the second nanosheet field-effect transistor device comprising a second gate structure having first sidewall spacers;
a second stacked transistor adjacent the first stacked transistor comprising:
a third nanosheet field-effect transistor disposed on a second bottom dielectric insulator layer, the third nanosheet field-effect transistor comprising a third gate structure; and
a fourth nanosheet field-effect transistor device stacked above the third nanosheet field-effect transistor, the fourth nanosheet field-effect transistor device comprising a fourth gate structure having second sidewall spacers;
a third sidewall spacer and a fourth sidewall spacer disposed on opposing sidewalls of the first stacked transistor and the second stacked transistor; and
a first metal via disposed between the third sidewall spacer and the fourth sidewall spacer.

15. The semiconductor structure of claim 14, wherein the first bottom dielectric insulator layer, the second bottom dielectric insulator layer, the first sidewall spacers and the second sidewall spacers each comprise a first dielectric material and the third sidewall spacer and the fourth sidewall spacer each comprise a second dielectric material different than the first dielectric material.

16. The semiconductor structure of claim 14, wherein the first metal via is connected to a back-end-of-the-line layer and to a backside power line.

17. The semiconductor structure of claim 14, further comprising a frontside source/drain contact disposed on a portion of a sidewall and a top surface of a source/drain region of the second nanosheet field-effect transistor device; and a second metal via connected to the frontside source/drain contact and to a first backside power line.

18. The semiconductor structure of claim 17, further comprising a backside metal contact disposed on a bottom surface of a source/drain region of the first nanosheet field-effect transistor and connected to a second backside power line.

19. The semiconductor structure of claim 14, further comprising a backside source/drain contact disposed on a portion of a sidewall and a bottom surface of a source/drain region of the third nanosheet field-effect transistor; and a second metal via connected to the backside source/drain contact and to a back-end-of-the-line layer.

20. An integrated circuit comprising one or more semiconductor structures, wherein at least one of the semiconductor structures is the semiconductor structure of claim 14.

* * * * *